(12) United States Patent
Hayashi et al.

(10) Patent No.: US 9,325,557 B2
(45) Date of Patent: Apr. 26, 2016

(54) RADIO COMMUNICATION APPARATUS AND PULSE SIGNAL TRANSMISSION METHOD IN RADIO COMMUNICATION APPARATUS

(71) Applicant: FUJITSU LIMITED, Kawasaki-shi (JP)

(72) Inventors: Hiroki Hayashi, Yokohama (JP); Takumi Itoh, Sakura (JP); Yasuhiro Nakasha, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 46 days.

(21) Appl. No.: 13/725,932

(22) Filed: Dec. 21, 2012

(65) Prior Publication Data

US 2013/0243045 A1 Sep. 19, 2013

(30) Foreign Application Priority Data

Mar. 19, 2012 (JP) ................................. 2012-062733

(51) Int. Cl.
*H04L 27/00* (2006.01)
*H04L 27/36* (2006.01)
*H04L 27/38* (2006.01)
(Continued)

(52) U.S. Cl.
CPC ............ *H04L 27/367* (2013.01); *H03G 3/3042* (2013.01); *H04B 1/38* (2013.01); *H04L 27/38* (2013.01)

(58) Field of Classification Search
CPC .............. H04B 1/00; H04B 3/00; H04B 7/00; H04B 14/00; H04B 17/00; H04B 2001/00; H04B 2201/00; H04J 13/00; H04J 2013/00; H03K 7/00; H03K 9/00; H03L 7/00; H04L 1/00; H04L 5/00; H04L 7/00; H04L 25/00; H04L 27/00; H04L 2001/00; H04L 2007/00; H04L 2025/00; H04L 2027/00; H03M 5/00
See application file for complete search history.

(56) References Cited

U.S. PATENT DOCUMENTS 8,054,908 B2 11/2011 Nakasha
2008/0247442 A1 10/2008 Orlik et al.
(Continued)

FOREIGN PATENT DOCUMENTS

JP 2006-191484 A 7/2006
JP 2008-205733 A 9/2008
(Continued)

OTHER PUBLICATIONS

Harmonized European Standard (Telecommunications series); "Fixed Radio Systems; Characteristics and requirements for point-to-point equipment and antennas; Part 3: Equipment operating in frequency bands where both frequency coordinated or uncoordinated deployment might be applied; Harmonized EN covering the essential requirements of article 3.2 of the R&TTE Directive;" ETSI EN 302 217-3 V1.3.1, pp. 1-60 (Jul. 2009).

*Primary Examiner* — Adolf Dsouza
(74) *Attorney, Agent, or Firm* — Fujitsu Patent Center

(57) ABSTRACT

A radio communication apparatus for generating a pulse signal corresponding to a data signal, amplifying the generated pulse signal, and transmitting the amplified pulse signal as a radio signal, the apparatus including: a reference pulse signal generation unit which generates a reference pulse signal of opposite phase to the pulse signal and amplifies the reference pulse signal; and a combining unit which combines the amplified pulse signal and the amplified reference pulse signal, wherein a combined pulse signal output from the combining unit is transmitted as the radio signal.

14 Claims, 15 Drawing Sheets

(51) Int. Cl.
*H04B 1/38* (2015.01)
*H03G 3/30* (2006.01)

(56) References Cited

U.S. PATENT DOCUMENTS

2008/0247486 A1* 10/2008 McCorkle ................... 375/295
2009/0232227 A1* 9/2009 Iida ............................. 375/242
2010/0091833 A1 4/2010 Nakasha

FOREIGN PATENT DOCUMENTS

| JP | 2009-502095 A | 1/2009 |
| JP | 2009-246947 A | 10/2009 |
| JP | 2010-98481 A | 4/2010 |

* cited by examiner

RADIO COMMUNICATION SYSTEM 10

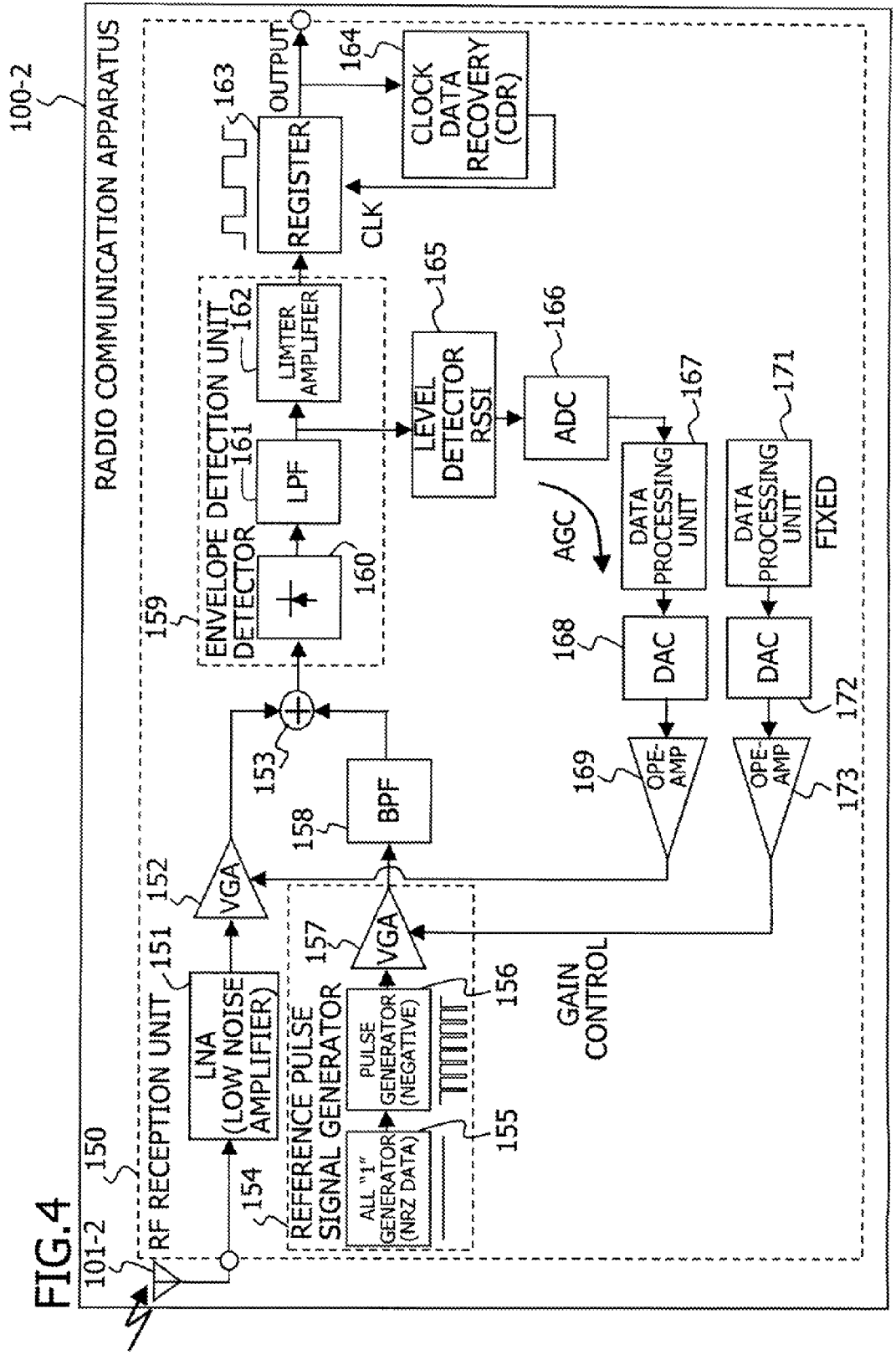

FIG.5C (A=2) 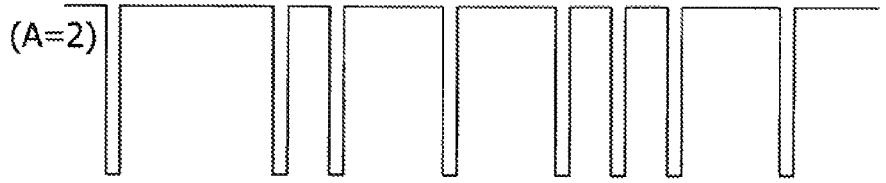
FIG.5D (A=1) 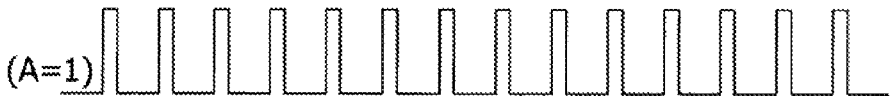

Power spectrum density (dB/Hz)

SPECTRUM WHEN REFERENCE PULSE NOT USED

Power spectrum density (dBm/Hz)

Unipolar RZ PG SPECTRUM

BRIGHT LINE SPECTRUM

BRIGHT LINE SPECTRUM

Frame:12   Frequency(GHz)

FIG.7A
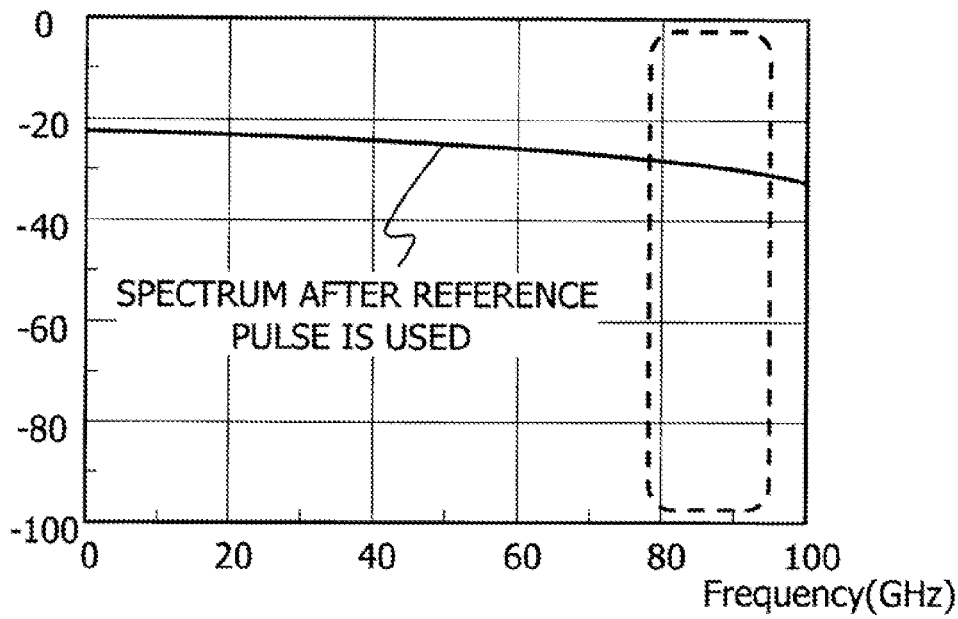
FIG.7B SPECTRUM WHEN REFERENCE PULSE IS USED
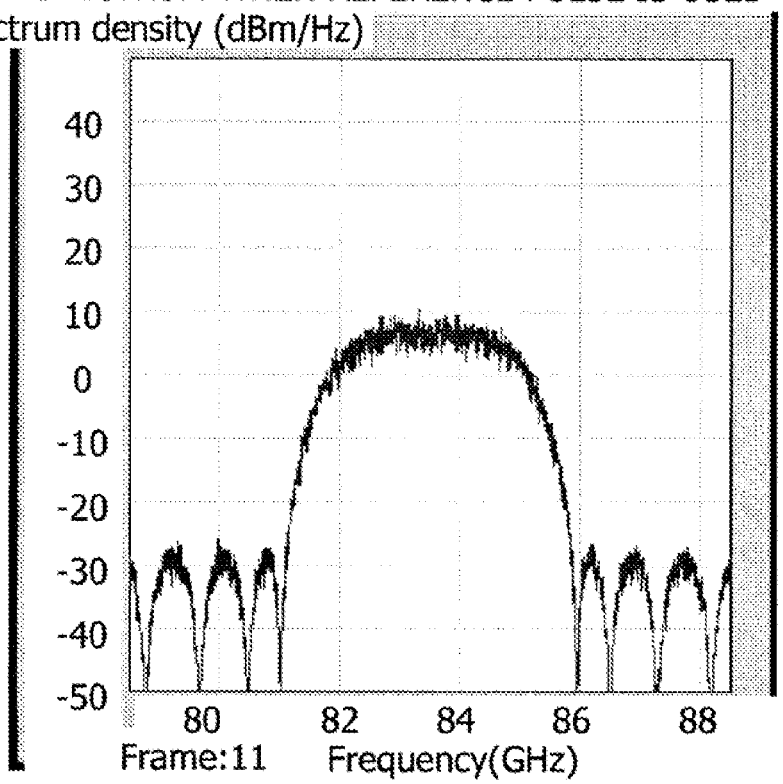

CONTROL INFORMATION APPENDED

FLG : Flag
Control : CONTROL INFORMATION
DA: DESTINATION ADDRESS
SA: TRANSMISSION SOURCE ADDRESS
Type: DISPLAY IN TYPE OF CAPSULATED FRAME
Data: STORED USER DATA
Check: FIELD FOR PERFORMING DATA ERROR CHECK

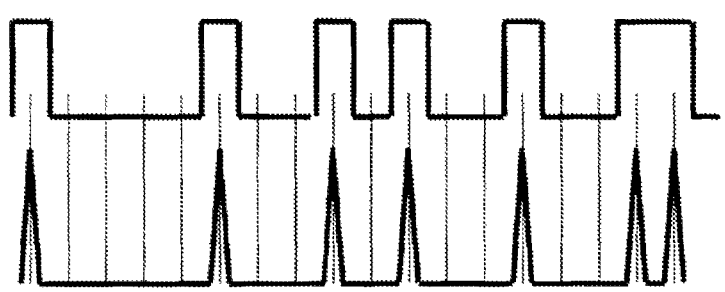
FIG.14A TRANSMISSION DATA
FIG.14B PULSE
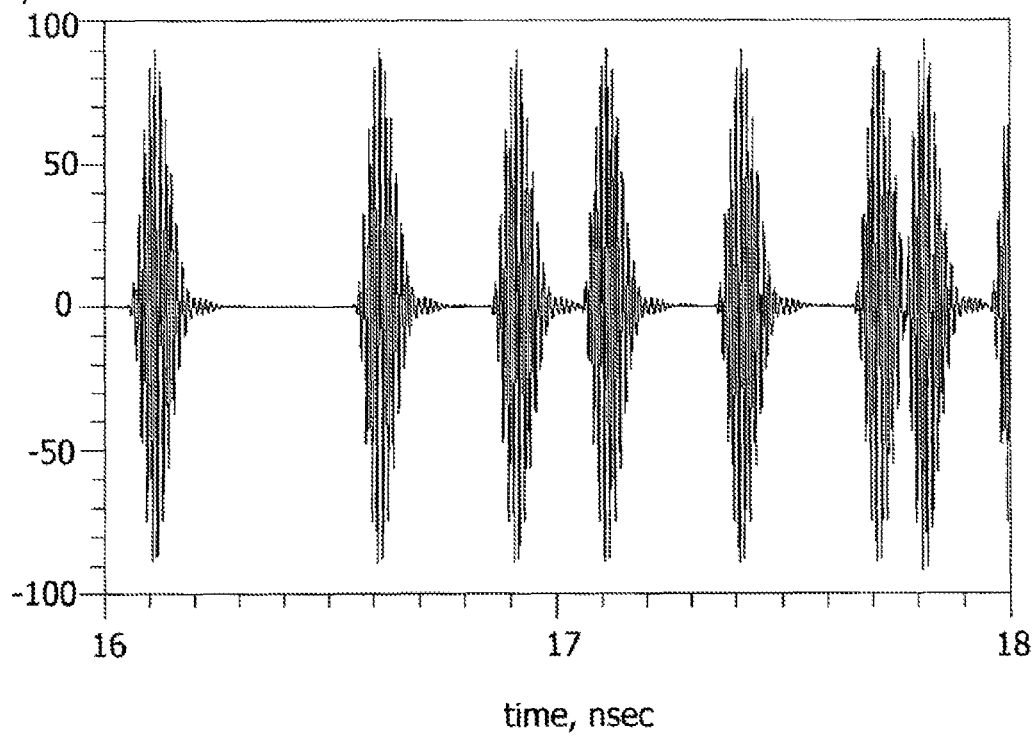
FIG.14C

RADIO COMMUNICATION APPARATUS AND PULSE SIGNAL TRANSMISSION METHOD IN RADIO COMMUNICATION APPARATUS

CROSS-REFERENCE TO RELATED APPLICATION

This application is based upon and claims the benefit of priority of the prior Japanese Patent Application No. 2012-062733, filed on Mar. 19, 2012, the entire contents of which are incorporated herein by reference.

FIELD

The embodiments discussed herein are related to a radio communication apparatus and pulse signal transmission method in a radio communication apparatus.

BACKGROUND

Conventionally, there is a radio communication system which transmit a data by using an impulse. In the radio communication system using the impulse, it is possible to achieve a transmission unit by, for example, a pulse generator and transmission amplifier. Consequently, in the radio communication system, it is possible to achieve a reduction in the number of components, in costs and so on, compared to a radio communication system such as a portable telephone and so on, since an oscillator, mixer and the like are not used.

In the radio communication system using the impulse, for example, transmission of data of large volumes not less than 1 Gbps is investigated, and use of a frequency band known as a millimeter wave band, such as 70 GHz to 100 GHz, is also investigated. The millimeter wave band suffers little radio wave attenuation due to absorption by the air, compared to other frequency band, therefore in the radio communication system using the impulse, it is possible to transmit a radio signal over several kilometers or more.

Next, a radio communication by an impulse system is described using FIG. 13A to FIG. 15B. Of these drawings, FIG. 13A illustrates a configuration example of a radio communication apparatus which uses impulses. The radio communication apparatus 200 includes a pulse generator 201, band pass filter (BPF) 202, transmission amplifier 203, switch 204, antenna 205, reception amplifier 206, BPF 207 and wave detector 208.

The transmission data is input to the pulse generator 201 and converted into a pulse (or impulse) corresponding to the transmission data. FIG. 14A and FIG. 14B illustrate examples of the correspondences between transmission data and pulse.

Returning to FIG. 13A, the pulse output from the pulse generator 201 is input to the BPF 202, and only an energy element of the used frequency band is extracted. FIG. 13B illustrates an example of a transmission band of the BPF 202. As illustrated in FIG. 13A, a millimeter wave pulse (or wave bundle) which oscillates near central frequency of the transmission band is output from the BPF 202.

Thereupon, the millimeter wave pulse is transmitted into space from the antenna 205 via the transmission amplifier 203 and switch 204, as a radio signal. For example, in radio communication based on a simplest impulse method, data transmission is performed by ON/OFF modulation in which one bit indicates the presence or absence of the millimeter wave pulse. FIG. 14C illustrates an example of the radio signal which is transmitted from the radio communication apparatus 200.

Returning to FIG. 13A, the radio communication apparatus 200 is able to receive the radio signal which is transmitted from another radio communication apparatus, and can receive the radio signal via the antenna 205, switch 204, and reception amplifier 206. In the radio signal (millimeter wave pulse) amplified by the reception amplifier 206, only energy element of the transmission band is extracted by the BPF 207. The wave detector 208 can detect the output of the BPF 207 (for example, by envelope wave detection) and can output the reception data.

FIG. 15A and FIG. 15B are graphs each representing an example of a spectral distribution of the radio signal transmitted from the radio communication apparatus 200, for example. These graphs can be obtained by converting the radio signal on a time axis to the radio signal on a frequency axis by applying a fast Fourier transform (FFT) to the radio signal transmitted from the radio transmission apparatus 200 (or the output signal of the transmission amplifier 203).

FIG. 15B illustrates an enlarged graph of the spectral distribution in the frequency band from 70 GHz to 100 GHz, from the graph in FIG. 15A. In these diagrams, the horizontal axis represents the frequency and the vertical axis represents signal intensity.

As illustrated in FIG. 15A and FIG. 15B, for example, there is a portion where peak of signal intensity is higher than the other frequencies. The portion where the signal intensity peak is higher than the frequencies may be called a bright line section or bright line spectrum, for example. The bright line spectrum is generated, for example, because in the millimeter wave pulse such as those illustrated in FIG. 14C, the energy of the pulses is concentrated at a prescribed frequency (for example, 80 GHz or 90 GHz) and a unipolar return to zero (RZ) type pulse generator 201 is used.

On the other hand, in various radio communication apparatuses, and not just the impulse system, the signal intensity for a per unit of frequency is stipulated by ordinance or specification, or the like, and the radio communication apparatus is designed and manufactured, and the like, so as to come within the stipulated range.

Patent Document 1: Japanese Laid-open Patent Publication No. 2008-205733
Patent Document 2: Japanese Laid-open Patent Publication No. 2010-98481
Non-Patent Document 1: ETSI EN 302 217-3 VI.3.1 (2009-7)

However, there is a case where the peak of the bright line spectrum described above is higher than a threshold value. Normally, a circuitry included in the radio communication apparatus and the like, is designed or manufactured in accordance with the peak of the signal intensity; for example, the transmission amplifier 203 of the radio communication apparatus 200 illustrated in FIG. 13A, or the like, is designed and manufactured in accordance with the peak signal intensity in the bright line spectrum.

Consequently, if the bright line spectrum having the peak higher than the threshold value is generated, then the circuitry, and the like, included in the radio communication apparatus 200, such as the transmission amplifier 203, becomes more expensive and the consumed power becomes larger, compared to a case where the peak is equal to or lower than the threshold value.

Conversely, if the peak of the bright line spectrum can be made lower than the threshold value, then it is possible to transmit the radio signal with low transmission power, compared to the case where the bright line spectrum is higher than the threshold value. If the radio signal can be transmitted with low transmission power, then it is possible to transmit the radio signal over a distance at or exceeding a threshold value, by making the transmission power higher than hitherto.

Furthermore, for example, if an upper limit value for the signal intensity per unit frequency is stipulated by ordinances or specifications, etc., then it is possible to observe the ordinances or specifications, etc., of this kind by designing and manufacturing the transmission amplifier 203, or the like, in such a manner that the signal intensity peak of the bright line spectrum is equal to or lower than the upper limit value.

SUMMARY

According to an aspect of the embodiments, a radio communication apparatus for generating a pulse signal corresponding to a data signal, amplifying the generated pulse signal, and transmitting the amplified pulse signal as a radio signal, the apparatus including: a reference pulse signal generation unit which generates a reference pulse signal of opposite phase to the pulse signal and amplifies the reference pulse signal; and a combining unit which combines the amplified pulse signal and the amplified reference pulse signal, wherein a combined pulse signal output from the combining unit is transmitted as the radio signal.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating a configuration example of the radio communication apparatus (reception unit);

FIG. 5A to FIG. 5G are diagrams which respectively illustrate examples of a signal waveform;

FIG. 7A and FIG. 7B are diagrams which respectively illustrate examples of the spectral distribution of a radio signal;

FIG. 14A, FIG. 14B and FIG. 14C are diagrams which respectively illustrate examples of transmission data, a pulse signal corresponding to transmission data and a radio signal.

DESCRIPTION OF EMBODIMENTS

Figure 1:
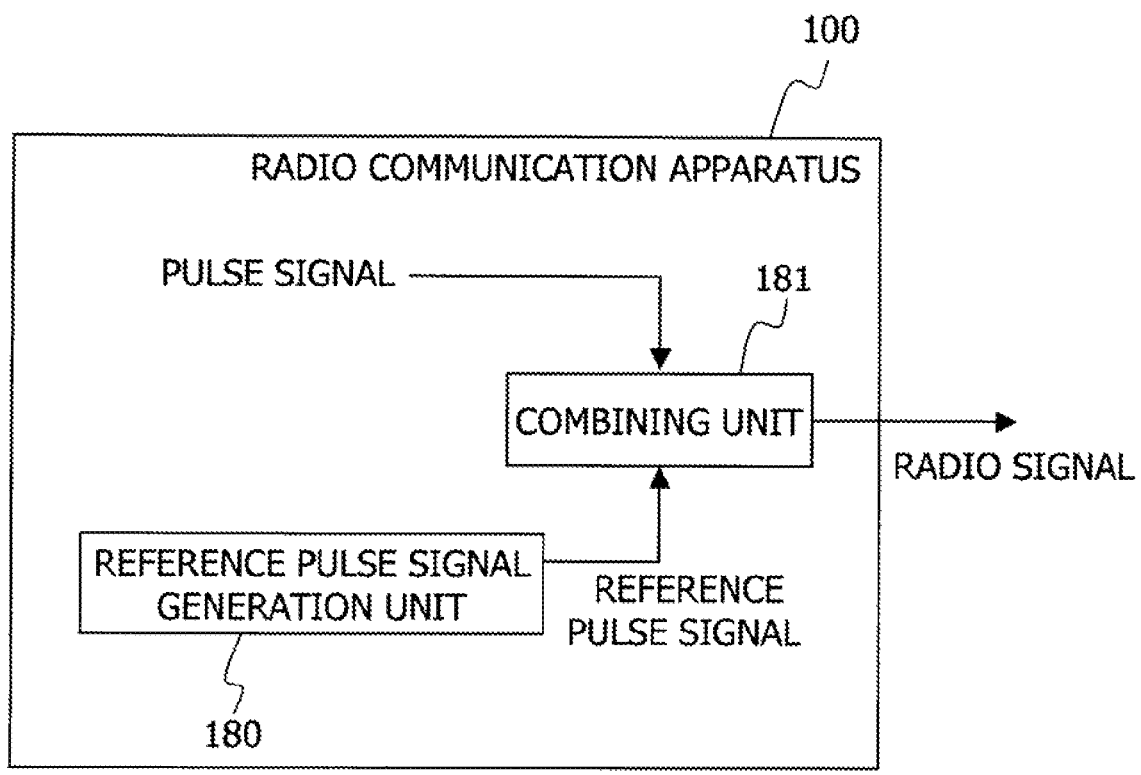
FIG. 1 is a diagram illustrating a configuration example of a radio communication apparatus.

Embodiments of the present invention are described below.
[First Embodiment]
Firstly, a first embodiment is described. FIG. 1 is a diagram illustrating a configuration example of a radio communication apparatus 100 according to a first embodiment. The radio communication apparatus 100 is an impulse radio communication apparatus which achieves a radio communication system that performs millimeter wave communication between base stations. The radio communication apparatus 100 generates a pulse signal corresponding to a data signal, and amplifies the generated pulse signal. The radio communication apparatus 100 is able to transmit the amplified pulse signal to the other radio communication apparatus as a radio signal.

As illustrated in FIG. 1, the radio communication apparatus 100 includes a reference pulse signal generator 180 and combining unit 181.

The reference pulse signal generation unit 180 generates a reference pulse signal of opposite phase to the pulse signal and amplifies the generated reference pulse signal.

The combining unit 181 combines the amplified pulse signal and the reference signal output from the reference pulse signal generation unit 180. The combined pulse signal is transmitted from the radio communication apparatus 100 as the radio signal.

The occurrence probability of codes "1" or "0" included in the data signal can generally be taken to be 50%, and based on this premise, the numbers of combined pulses output from the combining unit 181 corresponding respectively to the code "1" and "0" can be regarded as equal. Moreover, the reference pulse signal is of opposite phase to the pulse signal, and in the combined pulse, the pulses corresponding respectively to the code "1" and the code "0" in the data signal, for example, are of opposite phase.

Consequently, the frequency element of the pulse signal corresponding to the code "1" in the data signal and the frequency element of the pulse signal corresponding to the code "0" in the data signal cancel each other out and therefore it is possible to suppress the occurrence of a bright line pulse which has arisen in relation to the code "1" of the data signal, for example.

Figure 6A:
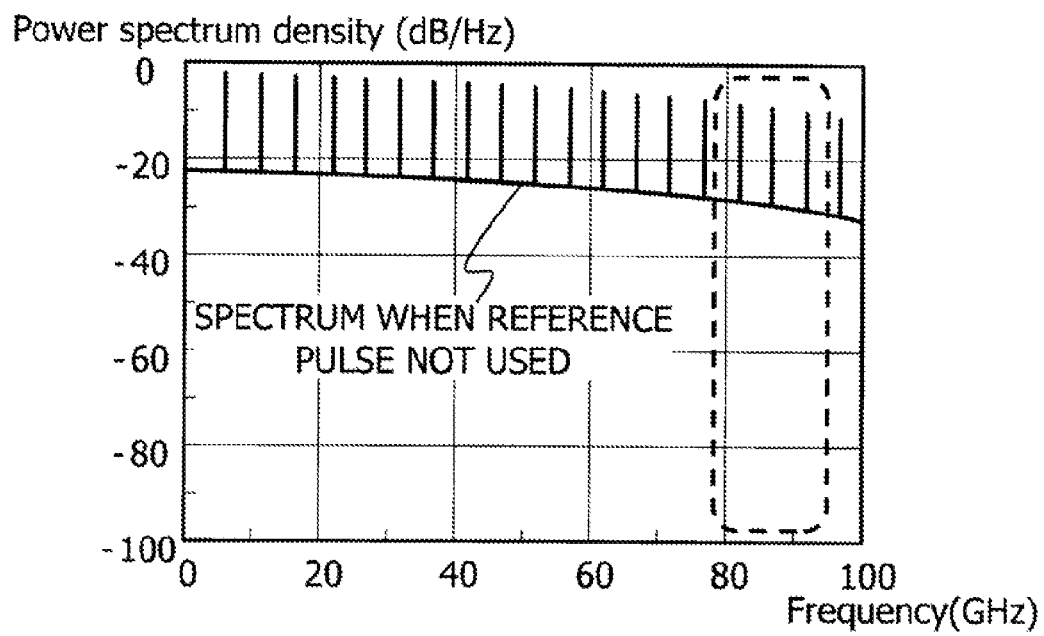
FIG. 6A and FIG. 6B are diagrams which respectively illustrate examples of the spectral distribution of a radio signal.
Figure 6B:
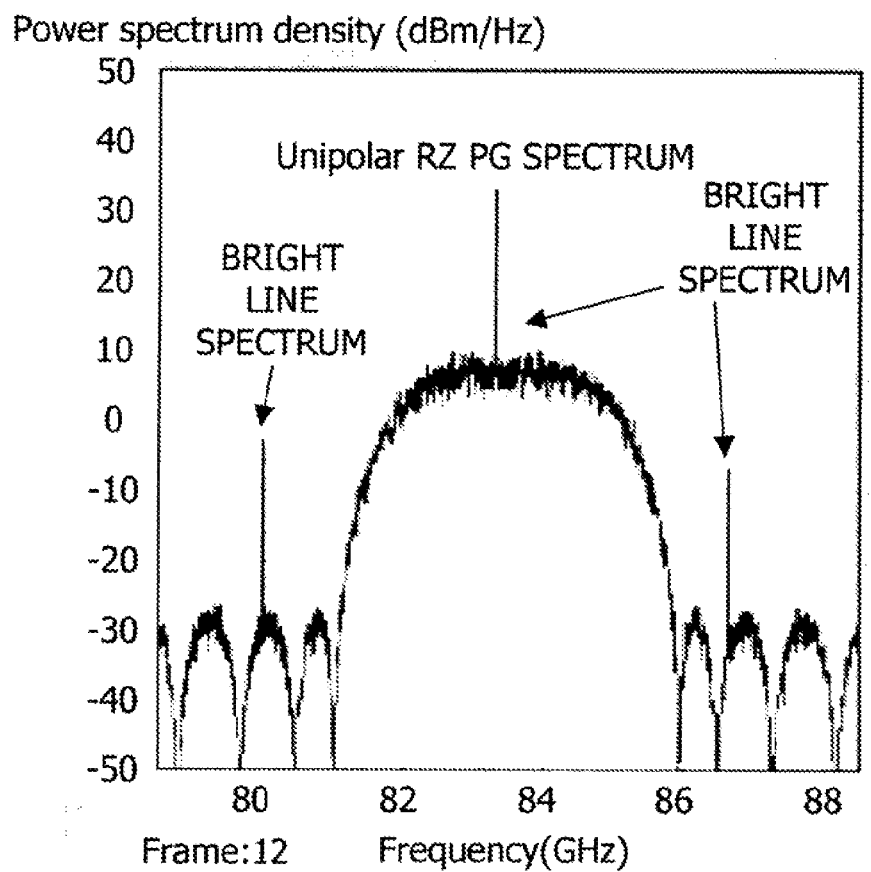

This is confirmed by the fact that the waveform in FIG. 6B becomes the waveform in FIG. 7B in a simulation. In this simulation, the input data is generated by a Bernoulli random generator.

Accordingly, for example, it is possible to design a circuit which saves transmission power, without taking account of the peak of a bright line spectrum in the radio signal which is transmitted by the radio communication apparatus 100, and without designing the circuitry in accordance with the peak of the bright line spectrum. Conversely, by using the saved transmission power as transmission power for the radio signal in the radio communication apparatus 100, it is possible to transmit the radio signal over a distance equal to or greater than a threshold value.

Consequently, the radio communication apparatus 100 according to the first embodiment can transmit the radio signal over the distance equal to or greater than the threshold value.

On the other hand, in the radio communication apparatus on the receiving side, provided that the reference pulse signal can be removed from the received radio signal, it is possible to extract the data signal and by detecting this data signal, the data signal transmitted from the radio communication apparatus 100 can be restored accurately. Therefore, the radio communication apparatus 100 is able to perform radio communication maintained good quality with the radio communication apparatus on the receiving side.

[Second Embodiment]

Next, a second embodiment of the invention is described. Firstly, an example of the configuration of the radio communication system according to the second embodiment is described, followed by a description of an example of the configuration of the radio communication apparatus included in the radio communication system, and finally a description of an example of operation in the radio communication apparatus.

<Example of Configuration of Radio Communication System>

Figure 2:
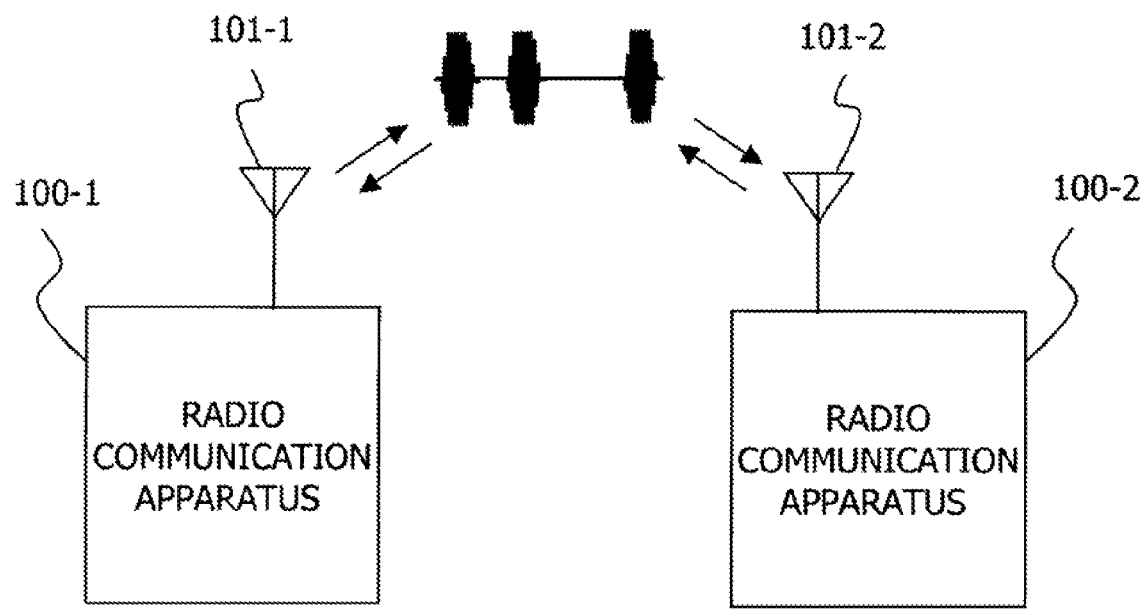
FIG. 2 is a diagram illustrating a configuration example of a radio communication system.

An example of the configuration of the radio communication system according to a second embodiment is described. FIG. 2 is a diagram illustrating a configuration example of a radio communication system 10.

The radio communication system 10 includes radio communication apparatuses 100-1 and 100-2, and the radio communication apparatuses 100-1 and 100-2 are capable of transmitting and receiving the radio signal to each other respectively via antennas 101-1 and 101-2.

In the second embodiment, the radio communication apparatuses 100-1 and 100-2 can perform radio communication with each other using an impulse. For example, in the radio communication apparatus 100-1, the pulse (or a sinusoidal wave) corresponding to the transmission data is generated, and the radio signal including a millimeter wave pulse (or a wave bundle) of which the frequency band is restricted by a band-pass filter can be transmitted. A "1" or "0" in the transmission data is represented by the presence or absence of the millimeter wave pulse. For example, when the millimeter wave pulse is "present", then the transmission data corresponds to "1", and when the millimeter wave pulse is "absent", the transmission data corresponds to "0".

A pulse is a rectangular waveform having a prescribed width, for example, and the impulse is a pulse of infinitely small time width and infinitely large height, for example, but in the present specification, the terms pulse and impulse are used without distinction, unless stated otherwise.

The radio communication apparatuses 100-1 and 100-2 of this kind can be used as a base station-to-base station communication means in a radio base station apparatus in the radio communication system, such as a portable telephone, for example. If a wired connection cannot be established between radio base stations, due to mountainous terrain, or the like, then communications can also be performed by radio communication of this kind, or the like. The example is no more than an example and the radio communication apparatuses 100-1 and 100-2 are not limited to being the radio base station apparatus, or the like.

FIG. 2 illustrates an example of one-to-one transmission and reception in relation to the two radio communication apparatuses 100-1 and 100-2, but apart from this, one-to-multiple, multiple-to-one or multiple-to-multiple transmission and reception is also possible, for example.

Furthermore, in this second embodiment, in order to simplify the explanation, a description is given in which the radio communication apparatus 100-1 is the transmitting side and the radio communication apparatus 100-2 is the receiving side. An example in which the radio communication apparatuses 100-1 and 100-2 are capable of both transmission and reception is described in the fifth embodiment, for example.

<Example of Configuration of Radio Communication Apparatus 100-1>

Next, respective examples of the configuration of the radio communication apparatuses 100-1 and 100-2 are described, but firstly, an example of the configuration of the radio communication apparatus 100-1 is described, next, an example of the configuration of the radio communication apparatus 100-2 is described. As described above, for example, the radio communication apparatus 100-1 is the transmitting side and the radio communication apparatus 100-2 is the receiving side.

Figure 3:
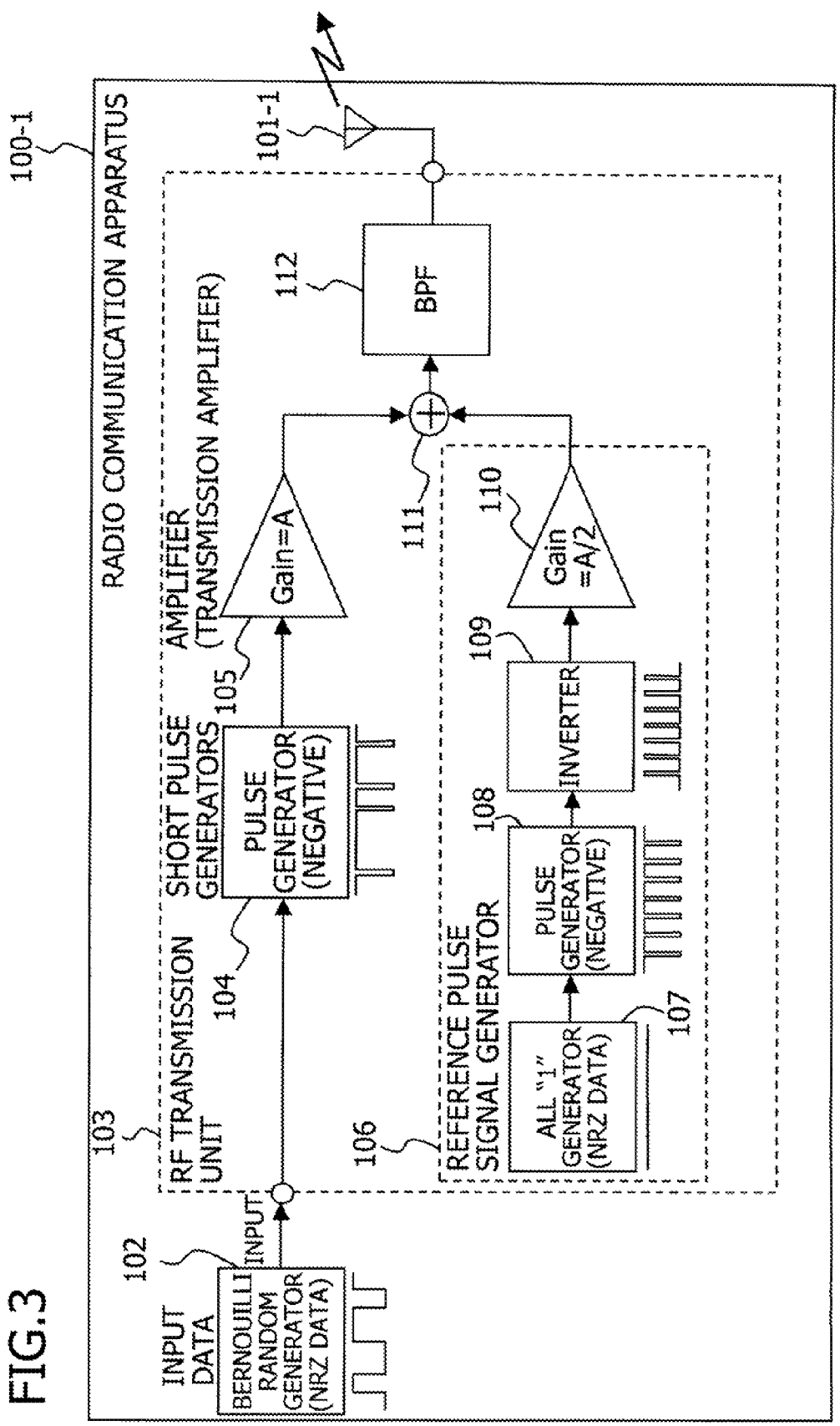
FIG. 3 is a diagram illustrating a configuration example of a radio communication apparatus (transmission unit)

FIG. 3 is a diagram illustrating a configuration example of the radio communication apparatus 100-1. The radio communication apparatus 100-1 includes an antenna 101-1, a Bernoulli random generator (hereinafter, called "random generator") 102, and an RF transmission unit 103.

The random generator 102 generates data to be transmitted to the radio communication apparatus 100-2, for example. The data is, for example, user data such as audio data or video data, etc. Furthermore, the data may be non-return-to-zero (NRZ) data, for example. The NRZ data is a data having the same pulse width as code transmission interval, for example, and is also a data in which each pulse does not need to return to "zero potential". In this case, the random generator 102 can randomly generate and output binary non-return-to-zero data.

The RF transmission unit 103 can input data output from the random generator 102, convert the data into the radio signal (RF signal) and output the converted data to the antenna 101-1.

The RF transmission unit 103 includes a pulse generator (or short pulse generator) 104, transmission amplifier (or amp) 105, reference pulse signal generator 106, combiner 111, and band pass filter (BPF) 112.

The pulse generator 104 generates a pulse signal corresponding to the input data which is output from the random generator 102. In this case, the pulse generator 104 generates a pulse signal by converting the input data, which is the non-return-to-zero data, into return to zero data. The return to zero data is a data which has a shorter pulse width than the code transmission interval and which is returned to "0 potential", for example.

The pulse generator 104 generates the pulse signal having negative logic. For example, the pulse generator 104 generates the pulse signal which is "0" when the input data is "0" and is "−1" when the input data is "1". The pulse generator 104 may also be composed by a multi-vibrator including a circuit such as a transistor, or the like, but in this second embodiment, the pulse generator 104 may be composed by various circuits without being restricted to this configuration in particular.

The transmission amplifier 105 amplifies the pulse signal output from the pulse generator 104 and outputs the signal to the combiner 111. In this second embodiment, the gain (or amplification rate) of the transmission amplifier 105 can be "A", for example.

On the other hand, the reference pulse signal generator 106 includes an ALL "1" generator 107, pulse generator 108, inverter 109, and transmission amplifier (or amp) 110.

The ALL "1" generator 107 generates data that is all "1". The data in this case is the non-return-to-zero data, for example. The ALL "1" generator 107 may be external to the RF transmission unit 103, and may also be external to the radio communication apparatus 100-1. For example, it is also possible to generate data that is always "1" and to input this data, from an apparatus that is external to the radio communication apparatus 100-1 or the like.

The pulse generator 108 generates the pulse signal corresponding to data output from the ALL "1" generator 107. In this case, the pulse generator 108 generates the pulse signal by converting the non-return-to-zero data to the return to zero data.

The pulse generator 108 generates the pulse signal having negative logic. In this case, since the data output from the ALL "1" generator 107 is all "1", then the pulse generator 108 can generate the pulse signal which repeats values of "0" and "−1" at uniform intervals apart.

The RF transmission unit 103 may include a clock generator (not illustrated), for example. In this case, two pulse generators 104 and 108 receive a clock from the clock generator and can respectively generate and output the pulse signal in synchronism with the clock. Consequently, for example, the two pulse generators 104 and 108 can output the pulse signal at the same timing.

The inverter 109 can generate the pulse signal of inverted logic with respect to the pulse signal output from the pulse generator 108. For example, the inverter 109 can generate the pulse signal which repeats values of "0" and "1" at a uniform interval. The inverter 109 may be called a sign inverter or logic inverting circuit, or the like, for example.

The transmission amplifier 110 amplifies the pulse signal output from the inverter 109 and outputs the signal to the combiner 111. In the second embodiment, the gain of the transmission amplifier 110 is "A/2" with respect to the gain "A" of the transmission amplifier 105 in relation to the input data.

The pulse signal output from the transmission amplifier 110 or the pulse signal output from the inverter 109 may be called a reference pulse signal, for example. The pulse in the reference pulse signal is inverted by the inverter 109, and therefore is of opposite phase to the pulse signal corresponding to the input data output from the transmission amplifier 105, for example.

The combiner 111 combines the pulse signal corresponding to the input data output from the transmission amplifier 105 and the reference pulse signal output from the transmission amplifier 110, and outputs the combined pulse signal to the BPF 112.

The BPF 112 filters the combined pulse signal so as to path through the prescribed frequency band. The prescribed frequency band can be set to 70 MHz to 90 MHz, for example, but in the second embodiment, a frequency band other than this may be employed. The BPF 112 can output the filtered pulse signal to the antenna 101-1 as the radio signal.

The antenna 101-1 can transmit the radio signal output from the BPF 112, to the radio communication apparatus 100-2.

<Example of Configuration of Radio Communication Apparatus 100-2>

Next, a configuration example of the radio communication apparatus 100-2 is described. FIG. 4 is a diagram illustrating a configuration example the radio communication apparatus 100-2. The radio communication apparatus 100-2 includes an antenna 101-2 and RF reception unit 150.

The antenna 101-2 can receive the radio signal transmitted from the radio communication apparatus 100-1 and output the signal to the RF reception unit 150.

The RF reception unit 150 can restore or reproduce the data transmitted from the radio communication apparatus 100-1, by applying envelope wave detection, or the like, to the received radio signal, for example.

The RF reception unit 150 includes a low noise amplifier (LNA) 151, variable gain amplifier (VGA) 152, combiner 153, reference pulse signal generator 154, BPF 158, envelope wave detection unit 159, resistor 163, clock data recovery (CDR) circuit 164, level detector 165, analog to digital converter (ADC) 166, data processing units 167 and 171, digital to analog converters (DAC) 168 and 172, and operational amps 169 and 173.

The low noise amplifier 151 amplifies the radio signal received by the antenna 101-2 and outputs the signal to the variable gain amplifier 152.

The variable gain amplifier 152 amplifies and outputs the output of the low noise amplifier 151, but this gain can be varied based on the input level of the radio signal output from the operational amplifier 169. More specifically, the gain of the variable gain amplifier 152 is adjusted automatically based on the output from the operational amplifier 169. The case may be called "automatic gain control" (AGC), for example. Consequently, the input level of the radio signal is adjusted in such a manner that the input level of the radio signal is not dependent on the attenuation due to the transmission path between the radio communication apparatuses 100-1 and 100-2, and the output of the variable gain amplifier 152 can be set to a uniform level.

The reference pulse signal generator 154 includes an ALL "1" generator 155, pulse generator 156 and variable gain amplifier 157.

The ALL "1" generator 155 is able to generate data that is all "1", similarly to the ALL "1" generator 107 of the radio communication apparatus 100-1, for example. The data in this case is also the non-return-to-zero data, for example.

The ALL "1" generator 155 may be external to the RF reception unit 150, or may be external to the radio communication apparatus 100-2.

The pulse generator 156 generates the pulse signal corresponding to the data output from the ALL "1" generator 155, for example. The pulse generator 156 generates the pulse signal by converting the non-return-to-zero data output from the ALL "1" generator 155 into the return to zero data. The pulse generator 156 generates the pulse signal having negative logic. In this case, the data output from the ALL "1" generator 155 is all "1", and therefore the pulse generator 156 can generate the pulse signal repeated "0" and "−1".

The variable gain amplifier 157 can amplify the pulse signal output from the pulse generator 156, and the gain can also be varied in accordance with the output from the operational amplifier 173. However, the gain of the variable gain amplifier 157 is adjusted by the data processing unit 171, and the like, so as to match the gain of the transmission amplifier 110 in the radio communication apparatus 100-1 on the transmitting side (for example, "A/2").

The pulse signal output from the variable gain amplifier 157 or the pulse signal output from the pulse generator 156 may be called the reference pulse signal, for example. Since the pulse in the reference pulse signal at the radio communication apparatus 100-2 does not be inverted by the inverter, then the pulse is of opposite phase to the reference pulse signal in the radio communication apparatus 100-1 side. Alternatively, the reference pulse signal output from the reference pulse signal generator 154 is the pulse signal which is in phase with (or in coordinated phase with) the pulse signal corresponding to the input data on the radio communication apparatus 100-1.

The BPF 158 filters the reference pulse signal output from the variable gain amplifier 157 so as to path through a prescribed frequency band. The BPF 158 is able, for example, to path through an element of the frequency band which is common with (or the same as) the output of the variable gain amplifier 157 in response to the radio signal input.

The combiner 153 combines the output of the variable gain amplifier 152 and the output of the BPF 158. In the combiner 111 in the radio communication apparatus 100-1, the input data is combined with the reference pulse signal. Consequently, the signal in which the input data and the reference pulse signal are combined is included in the output of the variable gain amplifier 152. In removing the reference signal combined on the radio communication apparatus 100-1 side in order to extract the input data, the reference pulse signal of opposite phase to the reference pulse signal combined on the radio communication apparatus 100-1 side should be added to the reception signal. Therefore, the reference pulse signal generator 154, for example, generates the reference pulse signal of opposite phase to the reference pulse signal generated by the radio communication apparatus 100-1 and the combiner 153 combines this reference pulse signal and the reception signal. Consequently, the output of the combiner 153 assumes the form of a received signal corresponding to the data transmitted from the radio communication apparatus 100-1, which does not include the reference pulse signal.

The envelope wave detection unit 159 detects the presence or absence of the millimeter wave pulse, by detecting the envelope relating to the signal after combining (for example, the millimeter wave pulses or wave bundle), and hence can detect ON/OFF modulated input data.

The envelope wave detection unit 159 includes a wave detector 160, low pass filter (LPF) 161 and millimeter amplifier 162.

The wave detector 160 includes a diode, for example, and can cut out the negative voltage from the output of the combiner 153 so as to output a positive voltage. The LPF 161 can output element having a voltage equal to or lower than the threshold value, from the output of the wave detector 160, for example. The limiter amplifier 162 can amplify the output of the LPF 161 in accordance with this amplitude, and limit the output to a uniform limit. The limiter amplifier 162 can, for example, output the pulse signal of a logic corresponding to the input data transmitted from the radio communication apparatus 100-1.

The register 163 is able to hold the output (pulse signal) of the limiter amplifier 162. The register 163 is able, for example, to hold the pulse signal output from the limiter amplifier 162, in synchronism with a clock output from the clock data recovery circuit 164, and read out the held pulse signal. Therefore, the writing and reading of the pulse signal in the register 163 can be performed in synchronism with the clock superimposed on the data transmitted from the radio communication apparatus 100-1.

The clock data recovery circuit 164 can separate the clock signal (CLK) from the pulse signal output from the register 163 and output the separated clock signal to the register 163. The clock data recovery circuit 164 can include a phase-locked loop (PLL), for example, in order to separate the clock signal.

The level detector 165 detects the output level of the LPF 161. For example, the level detector 165 estimates the intensity of the radio signal received by the radio communication apparatus 100-2 (RSSI: received signal strength indication), by detecting the output level of the LPF 161. The output of the level detector 165 is a direct current (DC) voltage corresponded to the input power.

The analog to digital converter 166 converts the output of the level detector 165 to digital, and outputs the signal to the data processing unit 167.

The data processing unit 167 generates the data corresponding to the control voltage applied to the variable gain amplifier 152 based on the output of the analog to digital converter 166, and outputs this data to the digital to analog converter 168, for example. The digital to analog converter 168 converts the output of the data processing unit 167 to an analog signal and the operational amplifier 169 amplifies the output of the digital to analog converter 168 and outputs the signal to the variable gain amplifier 152.

On the other hand, the data processing unit 171 is able to output a fixed digital value, and can input this value as a control voltage for the variable gain amplifier 157, via the digital to analog converter 172 and the operational amplifier 173. In this case, the data processing unit 171 can output a value whereby the gain of the variable amplifier 157 becomes "A/2".

<Operational Example>

Next, an example of the operation of the radio communication apparatuses 100-1 and 100-2 is described. This operational example is also described by taking the radio communication apparatus 100-1 to be the transmitting side and the radio communication apparatus 100-2 to be the receiving side.

FIG. 5A to FIG. 5G are diagrams respectively illustrating waveform diagrams of the signals of the each units in the radio communication apparatuses 100-1 and 100-2. The operational example is explained using FIG. 3 and FIG. 4 while referring to the waveform diagrams when necessary.

Figure 5A:
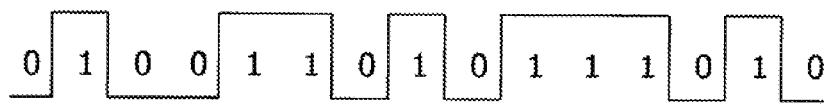

As illustrated in FIG. 3, firstly, the random generator 102 in the radio communication apparatus 100-1 generates input data and outputs the data to the RF transmission unit 103. FIG. 5A illustrates an example of the signal waveform of input data output from the random generator 102. As illustrated in FIG. 5A, the pulse signal corresponding to the input data is a waveform which is off when the code of the input data is "0" and is on when the code of the input data is "1". The input data is the non-return-to-zero data, for example.

Figure 5B:

Returning to FIG. 3, the pulse generator 104 generates the return to zero pulse signal in respect of the non-return-to-zero input data. FIG. 5B is a diagram illustrating an example of an output waveform of the pulse generator 104. In this case, since the signal has negative logic, the output of the pulse generator 104 is "0" when the input data is "0" and the output of the pulse generator 104 is "−1" when the input data is "1".

Returning to FIG. 3, the transmission amplifier 105 amplifies the pulse signal output from the pulse generator 104, by the gain "A", and outputs the amplified pulse signal. FIG. 5C is a diagram illustrating an example of the output waveform of the transmission amplifier 105. FIG. 5C illustrates an example of the output waveform in a case where the pulse signal output from the pulse generator 104 is amplified by A=2. In the example in FIG. 5C, the waveform repeated "0" and "−2" is obtained.

Returning to FIG. 3, in the reference pulse signal generator 106, the reference pulse signal is generated in the ALL "1" generator 107, and in the pulse generator 108, the pulse signal of negative logic is generated. The logic is inverted by the inverter 109, and in the transmission amplifier 110, the reference signal amplified by a gain of "A/2" is obtained. FIG. 5D illustrates an example of the output waveform of the reference pulse signal output from the transmission amplifier 110. The gain of the transmission amplifier 110 is "A/2", rather than the gain "A" of the transmission amplifier 105 with respect to the input data, and therefore the gain in the transmission amplifier 110 is "1" and the output waveform illustrated in FIG. 5D is obtained. The reference pulse signal is a waveform that repeats values of "1" or "0" at uniform intervals. The reference signal is a pulse signal of opposite phase and inverted polarity with respect to the pulse signal corresponding to the input data, for example (FIG. 5B or FIG. 5C, for example).

The two transmission amplifiers 105 and 110 output signals in synchronism with the clock from the clock oscillator, for example. Consequently, the output timings of the two transmission amplifiers 105 and 110 are matching, and for example, the output waveform of the transmission amplifier 105 is adjusted so as to become "0" or "−1" at the timing that the reference pulse signal becomes "1".

Figure 5E:
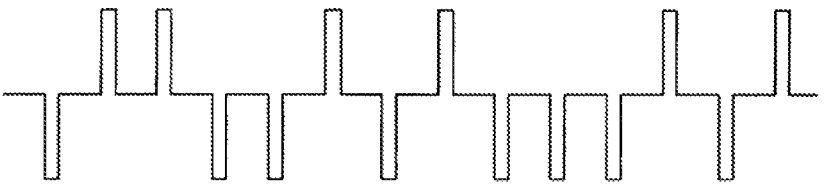

Returning to FIG. 3, the combiner 111 combines the outputs of the two transmission amplifiers 105 and 110. FIG. 5E is a diagram illustrating an example of the output waveform after combining. The output waveform after combining is the waveform including levels "−1", "0" and "1".

Figure 5F:
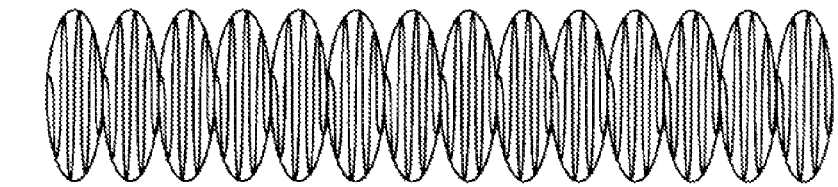

Returning to FIG. 3, the combined pulse signal is input to the BPF 112, and the energy element of the prescribed frequency band is extracted. FIG. 5F is a diagram illustrating an example of the output waveform of the BPF 112. This output waveform includes the pulse signal corresponding to the input data (for example, FIG. 5C) and the respective element of the reference pulse signal (for example, FIG. 5D).

The output of the BPF 112 is transmitted to the radio communication apparatus 100-2 as the radio signal (or a transmission signal) via the antenna 101-1.

As illustrated in FIG. 4, the radio signal received by the antenna 101-2 is input to the combiner 153 via the low noise amplifier 151 and the variable gain amplifier 152.

On the other hand, in the reference pulse signal generator 154, non-return-to-zero data which is all "1" is generated by the ALL "1" generator 155, and the non-return-to-zero data is converted to the return to zero data by the pulse generator 156, thereby generating the pulse signal of negative logic. The generated pulse signal is amplified by the variable gain amplifier 157 and output.

By combining the reception signal and the reference pulse signal output from the reference pulse signal generator 154, in the combiner 153, the element of the reference pulse signal combined in the radio communication apparatus 100-1 is removed and the pulse signal corresponding to the input data can be acquired.

Figure 5G:
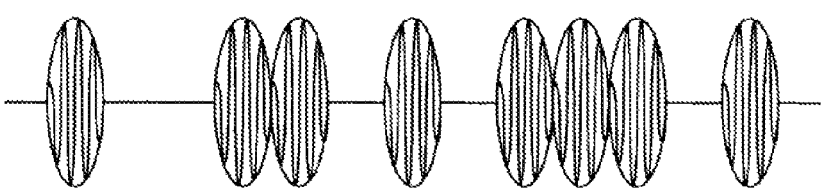

FIG. 5G is a diagram illustrating an example of the output waveform of the combiner 153. The waveform illustrated in FIG. 5G is the waveform corresponding to the waveform of the input data which is generated in the radio communication apparatus 100-1, for example, (see FIG. 5B and FIG. 5C, and the like). For example, a portion where there is the millimeter wave pulse corresponds to a "1" in the input data and a portion where there is no millimeter wave pulse corresponding to a "0" in the input data.

Returning to FIG. 4, in the envelope wave detection unit 159, an envelope relating to the output after combining is detected by the wave detector 160, the LPF 161 and the limiter amplifier 162, and the pulse signal corresponding to the input data can be obtained.

As described above, in the radio communication apparatus 100-1, the reference pulse signal is combined in respect of the pulse signal corresponding to the input data. In this case, the gain of the transmission amplifier 110 in the reference signal generator 106 is 50% of the gain of the transmission amplifier 105 in relation to the input data. The reasons why the reference pulse signal is combined in this way and why the gain of the transmission amplifier 110 is 50% of the gain in the transmission amplifier 105 are described below.

FIG. 6A and FIG. 6B are diagrams respectively illustrating examples of simulation results of a transmission spectrum relating to the radio signal. The examples in FIG. 6A and FIG. 6B are examples of a case where the radio communication apparatus 100-1 illustrated in FIG. 3 does not include the reference pulse signal generator 106, for example. In these drawings, the horizontal axis represents frequency (GHz) and the vertical axis represents power spectrum density (dB/Hz). FIG. 6B illustrates an enlarged graph of the spectral distribution around a frequency of 80 GHz to 90 GHz, in the distribution in FIG. 6A.

If the radio communication apparatus 100-1 does not include the reference pulse signal generator 106, as illustrated in FIG. 6A and FIG. 6B, then the bright line spectrum is generated at a prescribed frequency. The bright line spectrum is occurred, for example, because the energy of the millimeter wave pulse (or wave bundle) corresponding to "1" in the input data is concentrated at a prescribed frequency (for example, the transmission frequency band of the BPF 112). Therefore, by combining data which inverts the "1" level in the input data, concentration of the energy of the millimeter wave pulse at the particular frequency ceases to occur and the bright line spectrum can be removed, for example.

FIG. 7A and FIG. 7B are examples of simulation results of the transmission spectrum relating to the radio signal. In this example, the radio communication apparatus 100-1 includes the reference pulse signal generator 154 and the gain of the transmission amplifier 110 is 50% of the gain of the transmission amplifier 105.

As illustrated in FIG. 7A and FIG. 7B, there is no bright line spectrum in the frequency band from 0 GHz to 100 GHz, and simulation results illustrating an ideal spectral distribution can be obtained.

The reason is that although "1" and "−1" appear in the combined pulse signal illustrated in FIG. 5E, the energy at the prescribed frequency of the millimeter wave pulses corresponding to "1" is cancelled out by the millimeter wave pulses corresponding to "−1", for example (FIG. 5F, for example). Moreover, if the occurrence probability for all of the codes included in the radio signal, of the codes "1" (or "−1") in the combined pulse signal, is 50%, then the number of pulse signals corresponding to "1" and the number of pulse signals corresponding to "0" are the same, and in the whole radio signal, there ceases to be any concentration of the millimeter wave pulse corresponding to "1" at a prescribed frequency.

For example, if the gain of the transmission amplifier 110 is the same gain "A" as the transmission amplifier 105 relating to the input data, then the waveform illustrated in FIG. 5D includes two values: "0" and "2". In this case, the waveform of the combined pulse signal by the combiner 111 (for example, FIG. 5E) includes "0" and "2", and there is no element that cancels out the millimeter wave pulse corresponding to "2". Therefore, if the gain of the transmission amplifier 110 is "A", then the bright line pulse may be generated in relation to the transmitted radio signal.

Setting the gain of the transmission amplifier 110 to "A/2" corresponds to the occurrence probability of the code "1" (or the code "0") in the input data, and is based on the premise that the occurrence probability is 50%, for example. For example, upon comparison of FIG. 5A with FIG. 5E, the output of the combiner 111 becomes "−1" when the input data is "1", and the output of the combiner 111 becomes "1" when the input data is "0". Consequently, when the occurrence probability of "1" (or "0") in the input data is 50%, the occurrence probability of "−1" (or "1") in the output pulse signal of the combiner 111 is also 50%.

If the occurrence probability of "1" in the input data is 50% in this way, then the number of pulse signals of "1" and the number of pulse signals of "−1" in the output pulse signal of the combiner 111 are matching. The frequency element corresponding to "1" in the transmitted radio signal is cancelled by the frequency element corresponding to "−1". Consequently, if the occurrence probability of "1" (or "0") in the input data is 50%, then by setting the gain of the transmission amplifier 110 to 50% of the gain of the transmission amplifier 105, the energy does not concentrate at the frequency element corresponding to "1", and the bright line pulse can be eliminated. Alternatively, if the occurrence probability of "1" (or "0") in the input data is 50%, it is possible to eliminate the bright line pulse by setting the signal intensity of the reference pulse signal to 50% with respect to the signal intensity of the pulse signal corresponding to the input data.

An example where the occurrence probability of "1" in the input data is not 50% is described in the third and fourth embodiments.

In this way, the radio communication apparatus 100-1 combines the reference pulse signal of opposite phase and the pulse signal corresponding to the input data. If the occurrence probability of "1" in the input data is 50%, it is possible to transmit the radio signal having the spectral distribution that does not generate the bright line pulse, by setting the signal intensity of the reference pulse signal to 50% with respect to the pulse signal corresponding to the input data.

Consequently, the radio communication apparatus 100-1 can operate a circuit such as the transmission amplifier 105 with a low power consumption compared to a case where the reference pulse signal generator 106 is not included, and can transmit the radio signal over a distance equal to that in a case where the reference pulse signal generator 106 is not included.

Therefore, the radio communication apparatus 100-1 can also transmit the radio signal over the distance equal to or greater than a threshold value, by using the saved power consumption as transmission power (for example, as power consumption for the transmission amplifier 105, for example).

Furthermore, in the radio communication apparatus 100-2 on the receiving side, the reference pulse signal is generated, but in this case, the pulse signal of opposite phase to the reference pulse signal on the transmitting side (or of the same phase as the pulse signal corresponding to the input data) is generated, so as to combined the received signal.

Accordingly, in the radio communication apparatus 100-2 on the receiving side, the pulse signal combined with the input data is removed and the input data can be restored. Consequently, the radio communication apparatuses 100-1 and 100-2 can perform radio communication maintained quality.

[Third Embodiment]

Figure 8:
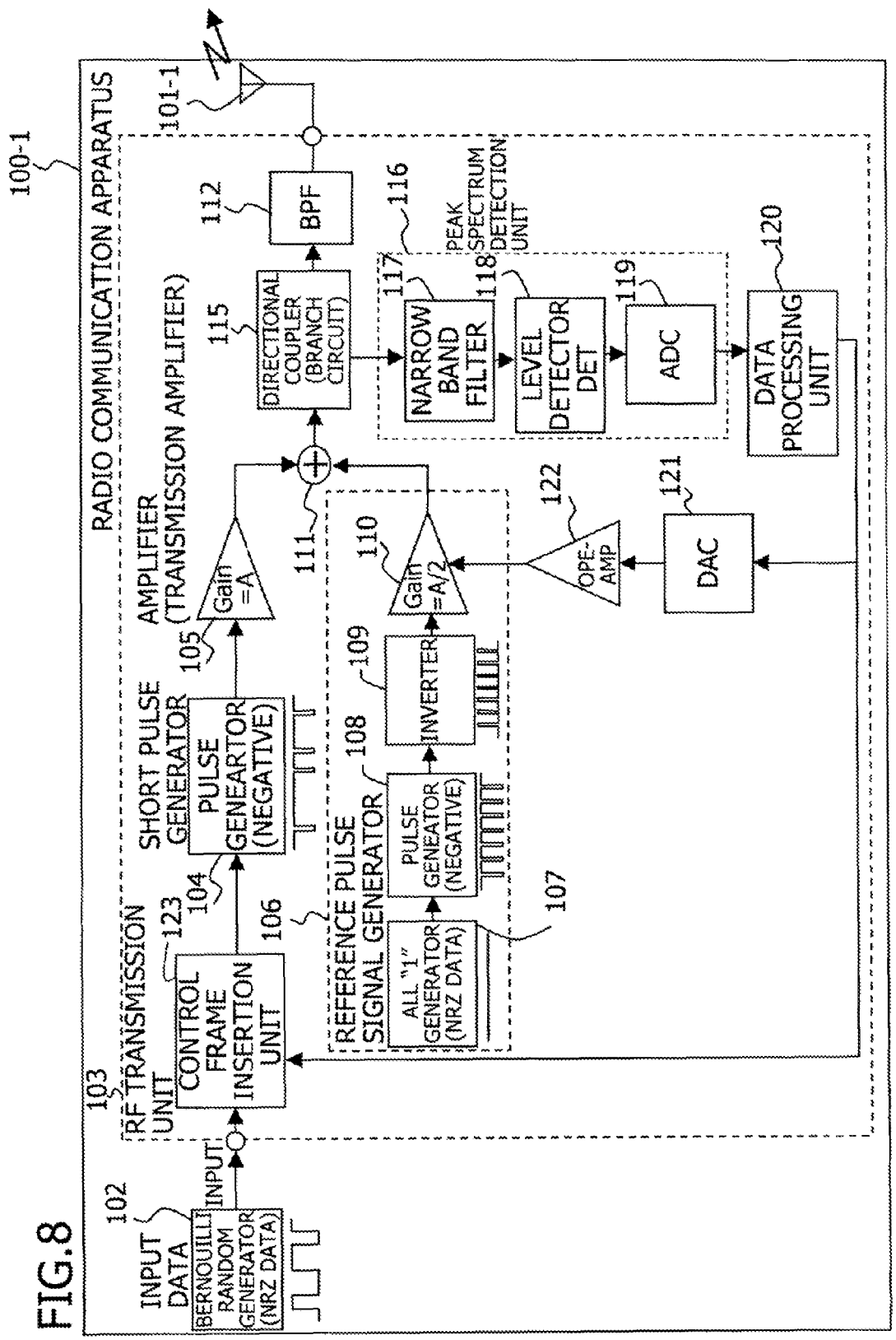
FIG. 8 is a diagram illustrating a configuration example of a radio communication apparatus (transmission unit)
Figure 9:
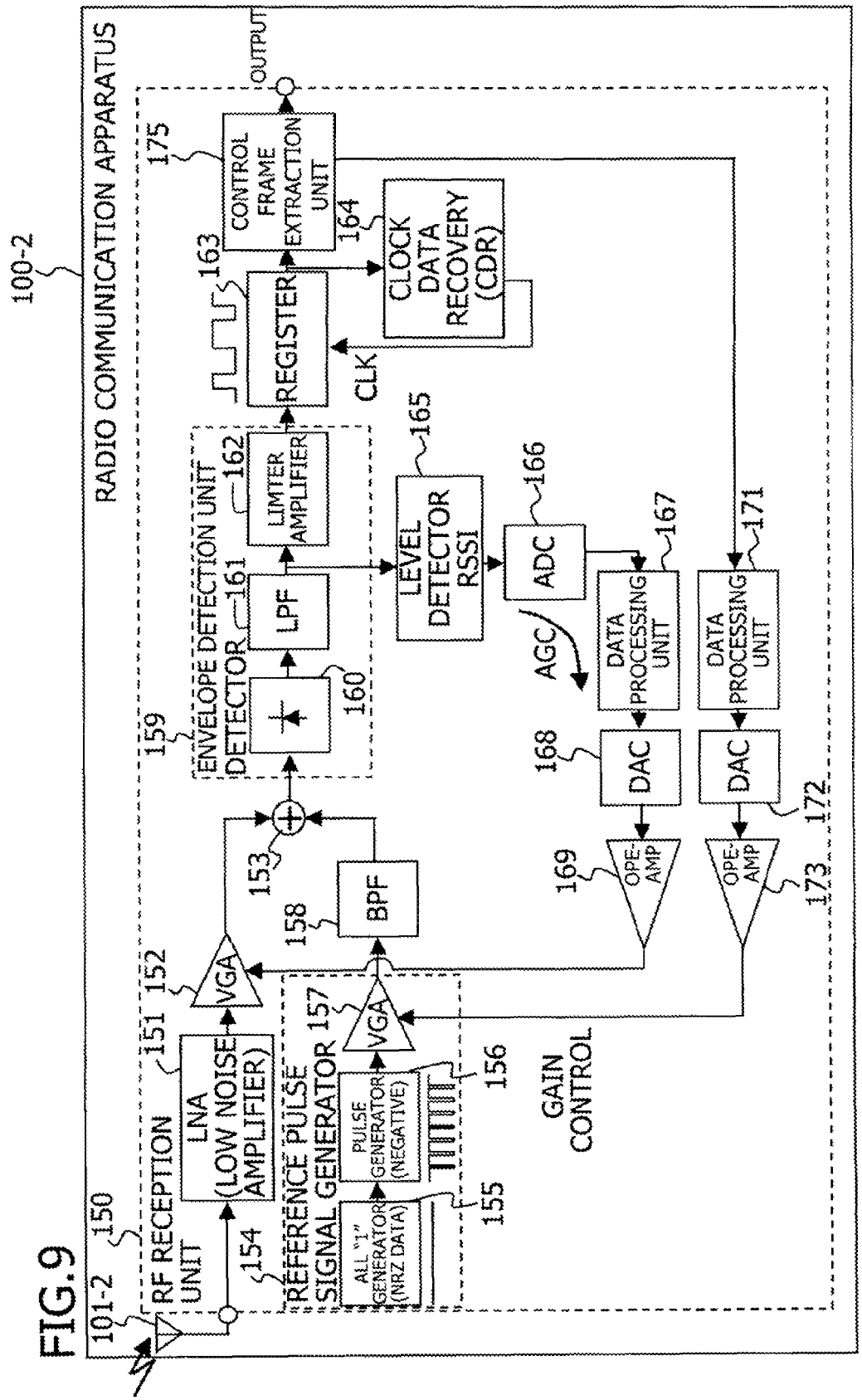
FIG. 9 is a diagram illustrating a configuration example of a radio communication apparatus (reception unit)

Next, a third embodiment of the invention is described. The third embodiment is an example of a case where the occurrence probability of "1" or "0" in the input data has varied from 50%. FIG. 8 and FIG. 9 are diagrams respectively illustrating configuration examples of the radio communication apparatuses 100-1 and 100-2 in the third embodiment.

As illustrated in FIG. 8, the radio communication apparatus 100-1 also includes a branch circuit (a directional coupler) 115, peak spectrum detection unit 116, data processing unit 120, digital to analog converter 121, operational amplifier 122 and control frame introduction unit 123.

The branch circuit 115 outputs the output from the combiner 111 to the BPF 112 and the peak spectrum detection unit 116.

Upon detecting a peak signal in the pulse signal combined by the combiner 111, the peak spectrum detection unit 116 changes the gain of the transmission amplifier 110 from "A/2", since the occurrence probability of "1" in the input data has changed.

The peak spectrum detection unit 116 includes a narrow band filter 117, level detection unit 118, and analog to digital converter 119.

The narrow band filter 117 can path through an element of a prescribed frequency band in the combined pulse signal. The narrow band filter 117 is able to path through an element of a frequency where it is estimated that the bright line spectrum is present, for example. This frequency can use a frequency previously measured by simulation, or the like, for example.

The level detector 118 detects the output level of the pulse signal output from the narrow band filter 117, for example. The level detector 118 can output a DC voltage corresponding to the level of the pulse signal of a prescribed band which is output from the narrow band filter 117, for example.

The analog to digital converter 119 can convert the output level detected by the level detector 118 to a digital value.

The data processing unit 120 inputs the level (digital value) detected by the level detector 118, and if this level is equal to or greater than the threshold value, it can be determined that the radio signal includes the bright line pulse. In this case, the data processing unit 120 can calculate a change value so as to change the gain of the transmission amplifier 110 in a range from 40% to 60%, with respect to the gain of the transmission amplifier 105, for example. By setting the change value α to "±A/10", the gain of the transmission amplifier 110 becomes "A/2±A/10", and can be changed in a range from 40% to 60% with respect to the gain "A" of the transmission amplifier 105. For example, the data processing unit 120 can also set a change value α corresponded to the level of the pulse signal detected by the level detector 118.

The change value α is converted to an analog value by the digital to analog converter 121, amplified by the operational amplifier 122 and input to the transmission amplifier 110. The transmission amplifier 110 can amplify the pulse signal corresponding to the reference pulse signal by a gain to which the change value α has been added.

For example, FIG. 5E illustrates an example of the output waveform of the combiner 111 in a case where the occurrence probability of "1" in the input data is 50%, but in this case, the number of pulses having a level of "1" and the number of pulses having a level of "−1" may be set to the same number. Consequently, in the radio signal corresponding to the pulse signal like this, the energy of the prescribed frequency in the millimeter wave pulse corresponding to "1" is cancelled out by the energy of the prescribed frequency in the millimeter wave pulse corresponding to "−1", and hence the bright line pulse can be removed, for example.

When the occurrence probability of "1" in the input data changes from 50%, then in the output waveform of the combiner 111, for example, the number of pulses having a level of "1" and the number of pulses having a level of "−1" no longer match each other. For example, in the example illustrated in FIG. 5E, the number of "−1" is greater than or less than that of "1".

In this situation, for example, in the example illustrated in FIG. 5D, the gain of the reference signal is changed from "A=1". In this case, the height of each pulse in the reference signal varies and the height of the "−1" pulses in the output waveform of the combiner 111 (FIG. 5E, for example) also varies. For instance, this variation in height is capable of preventing concentration of the energy at the prescribed frequency in the whole radio signal, and of preventing the occurrence of the bright line pulse which arises due to the occurrence probability of "1" in the input data changing from 50%.

Furthermore, the control frame insertion unit 123 receives the change value α from the data processing unit 120 and is able to insert this change value α into a control frame transmitted from the radio communication apparatus 100-1. The control frame is, for example, the transmission frame transmitted to the radio communication apparatus 100-2 on the receiving side, from the radio communication apparatus 100-1 on the transmitting side.

Figure 10:
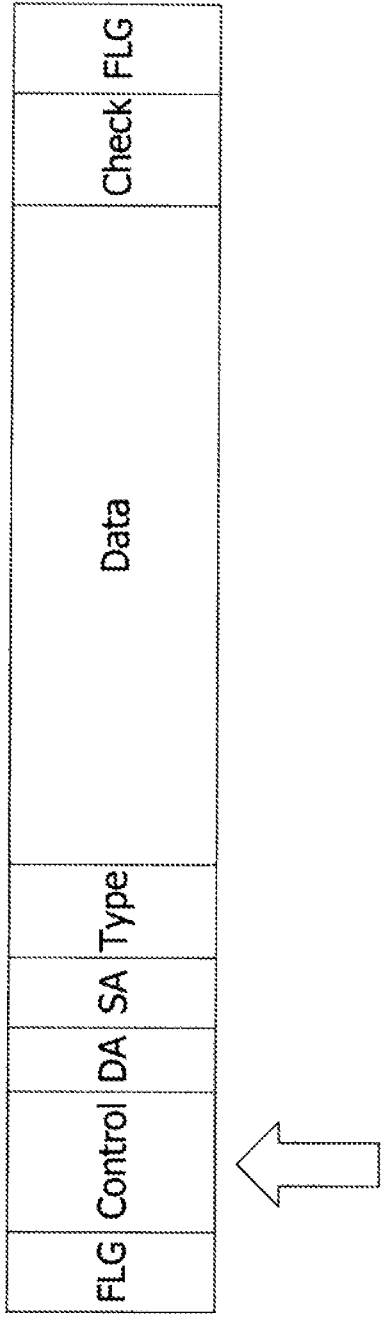
FIG. 10 is a diagram illustrating a configuration example of a transmission frame.

FIG. 10 illustrates a configuration example of the control frame which is transmitted from the radio communication apparatus 100-1. In the third embodiment, the control frame includes the data field which transmits data (a "Data" field), and also includes a field which transmits control information (a "Control" field). The control frame insertion unit 123 is able to insert the change value α in the field which transmits control information, for example.

FIG. 9 is a diagram illustrating a configuration example of the radio communication apparatus 100-2 on the receiving side. The radio communication apparatus 100-2 also includes a control frame extraction unit 175.

The control frame extraction unit 175 can extract the change value α included in the control frame, from the output from the register 163, and output this change value α to the data processing unit 171. The data processing unit 171 calculates the gain to be supplied to the variable gain amplifier 157, and outputs this gain to the variable gain amplifier 157 via the digital to analog converter 172 and the operational amplifier 173. The variable gain amplifier 157 can operate based on the gain to which the change value α reported from the radio communication apparatus 100-1 is added. Consequently, for example, the gain of the variable gain amplifier 157 can match the gain of the transmission amplifier 110 in respect of the reference pulse signal on the transmitting side. Thereupon, in the radio communication apparatus 100-2 on the receiving side, for example, the reference pulse signal that is combined with the pulse signal corresponding to the input data in the radio communication apparatus 100-1 on the transmitting side is removed, and the input data can be restored accurately. Furthermore, the radio communication apparatus 100-2 on the receiving side can perform processing synchronized with the radio communication apparatus 100-1 on the transmitting side.

In the third embodiment, the radio communication apparatus 100-1 changes the amplification rate in relation to the reference pulse signal, when a peak signal is detected in the combined pulse signal, while the gain of the transmission amplifier 110 is set to 50% of the gain of the transmission amplifier 105, for example.

Accordingly, for example, the radio communication apparatus 100-1 is able to remove, from the radio signal, the bright line spectrum generated when the occurrence probability of "1" or "0" in the input data is changed from 50%. Therefore, the radio communication apparatus 100-1 according to the third embodiment is also capable of transmitting the radio signal over the distance equal to or greater than the threshold value. In this case, since the change value α of the transmission amplifier 110 on the transmitter side is reported to the radio communication apparatus 100-2 on the receiving side, then the radio communication apparatus 100-2 can change the gain of the variable gain amplifier 157 on the basis of this change value, and can remove the reference signal combined by the transmitting side and restore the input data accurately. Consequently, on the receiving side, it is possible to restore data maintained quality.

[Fourth Embodiment]

Next, a fourth embodiment of the invention is described. The fourth embodiment is also an example in which the occurrence probability of "1" or "0" in the input data has changed from 50%.

Figure 11:
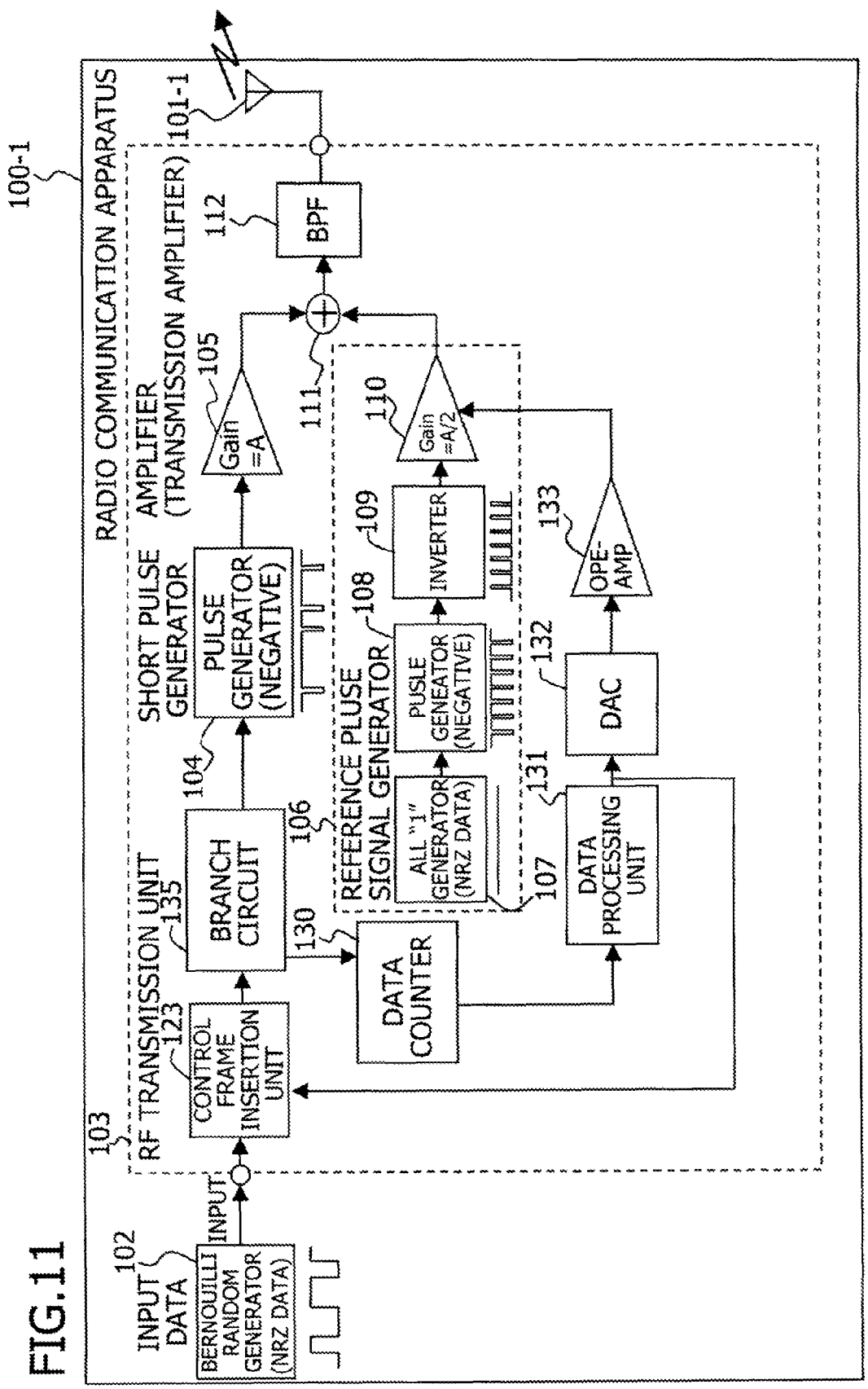
FIG. 11 is a diagram illustrating a configuration example of a radio communication apparatus (transmission unit)

FIG. 11 is a diagram illustrating a configuration example of the radio communication apparatus 100-1 in the fourth embodiment. In this fourth embodiment, by directly counting the codes "1" (or "0") of the input data, it is detected whether or not the occurrence probability has changed from 50%, and the gain of the transmission amplifier 110 is changed from "A/2" in accordance with this occurrence probability.

As illustrated in FIG. 11, the radio communication apparatus 100-1 also includes a branch circuit 135, data counter 130, data processing unit 131, digital to analog converter 132, and operational amplifier 133.

The data counter 130 counts the number of pulse signals corresponding to the code "1" in the input data which is output from the control frame insertion unit 123, for example. The data counter 130 may count the number of pulses corresponding to the code "0" in the input data, for example.

The data processing unit 131, for example, saves the count value output from the data counter 130 over a prescribed period of time, calculates the average occurrence probability of the code "1", and if this average occurrence probability is equal to or greater than the threshold value, the data processing unit 131 can generate and output a change value α of the gain corresponding to the transmission amplifier 110. Similarly to the fourth embodiment, for example, the change value α can be in a range of 40% to 60% with respect to the gain "A" of the transmission amplifier 105. The data processing unit 131 can change the gain of the transmission amplifier 110 from "A/2" by changing the change value α in accordance with the occurrence probability of the code "1", for example.

Furthermore, the data processing unit 131 can also assume that the occurrence probability of the code "1" in the input data is about 50%, when the average occurrence probability is less than the threshold value, and can keep the gain of the transmission amplifier 110 at "A/2" without making any particular output.

In the radio communication apparatus 100-1 according to this fourth embodiment, the data processing unit 131 outputs the change value α to the control frame insertion unit 123, and the change value α can be inserted into the control frame by the control frame insertion unit 123 and transmitted to the radio communication apparatus 100-2 on the receiving side.

A configuration example of the radio communication apparatus 100-2 according to the fourth embodiment can be illustrated by FIG. 9, similarly to the radio communication apparatus 100-2 according to the third embodiment, for example. The radio communication apparatus 100-2 on the receiving side is able to make the intensity of the reference pulse signal follow the change in the intensity of the reference pulse signal on the transmission side, by extracting the change value α in the control frame extraction unit 175 and outputting the change value α to the variable gain amplifier 157. Furthermore, the radio communication apparatus 100-2 on the receiving side can perform processing in the variable gain amplifier 157 based on the change value α, and therefore can synchronize with the radio communication apparatus 100-1 on the transmitting side, similarly to the third embodiment.

In this way, the radio communication apparatus 100-1 in the fourth embodiment can detect whether or not the occurrence probability changes from 50% by counting the number of pulses of the code "1" (or "0") in the input data by the data counter 130.

The radio communication apparatus 100-1 can then remove the bright line spectrum, similarly to the third embodiment, by changing the amplification rate of the reference pulse signal in accordance with the occurrence probability of the code "1" when it has been detected that the occurrence probability of code "1" has changed from 50%. Consequently, the radio communication apparatus 100-1 is able to transmit the radio signal over a distance equal to or greater than the threshold value.

In this case, the radio communication apparatus 100-2 on the receiving side can receive the change value α and therefore remove the reference pulse signal combined on the transmitting side and restore the input data accurately. Therefore, the quality of the data is maintained.

[Fifth Embodiment]

In the second to fourth embodiments, the radio communication apparatus 100-1 is described as the transmitting side and the radio communication apparatus 100-2 is described as the receiving side. For example, the radio communication apparatuses 100-1 and 100-2 can both be made capable of both transmission and reception.

Figure 12:
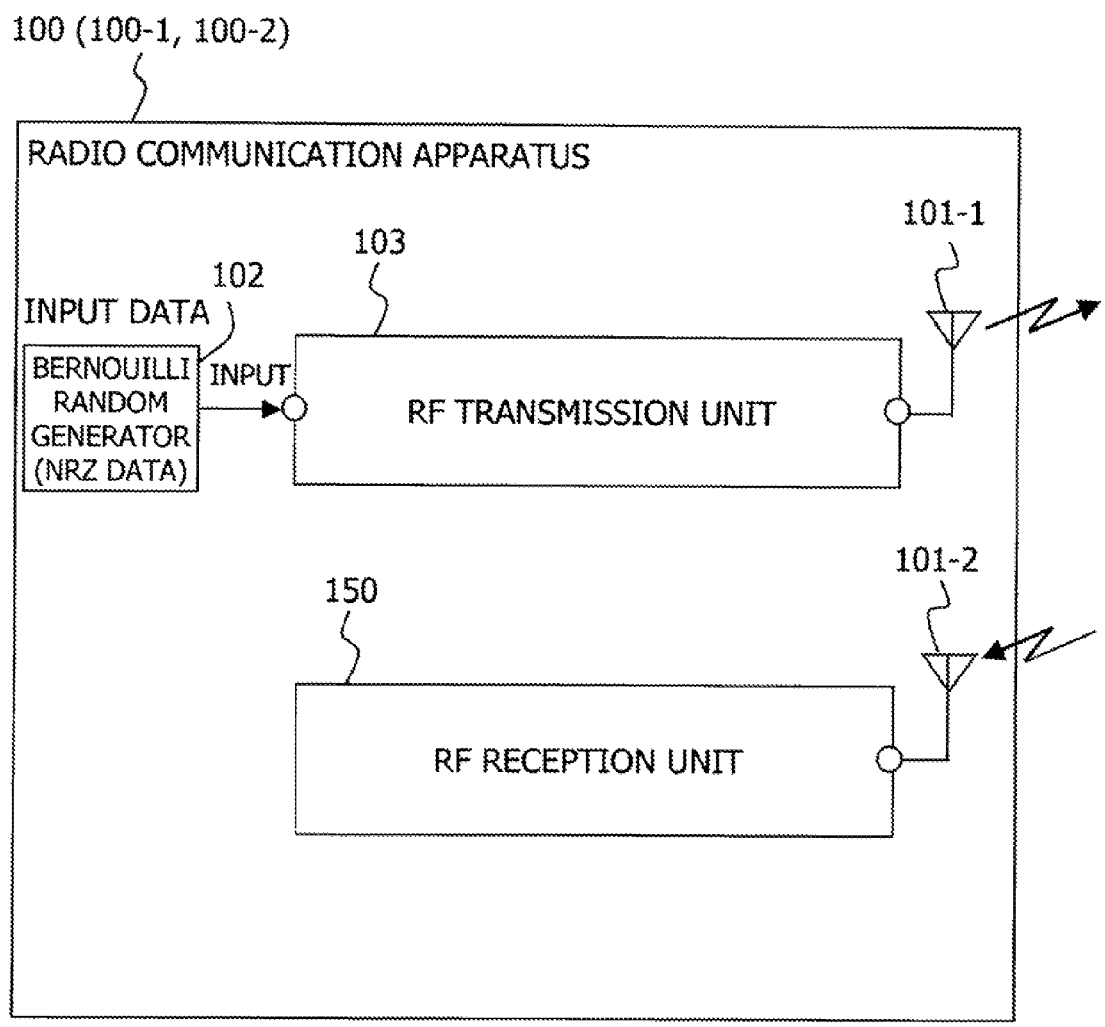
FIG. 12 is a diagram illustrating a configuration example of a radio communication apparatus.
Figure 13A:
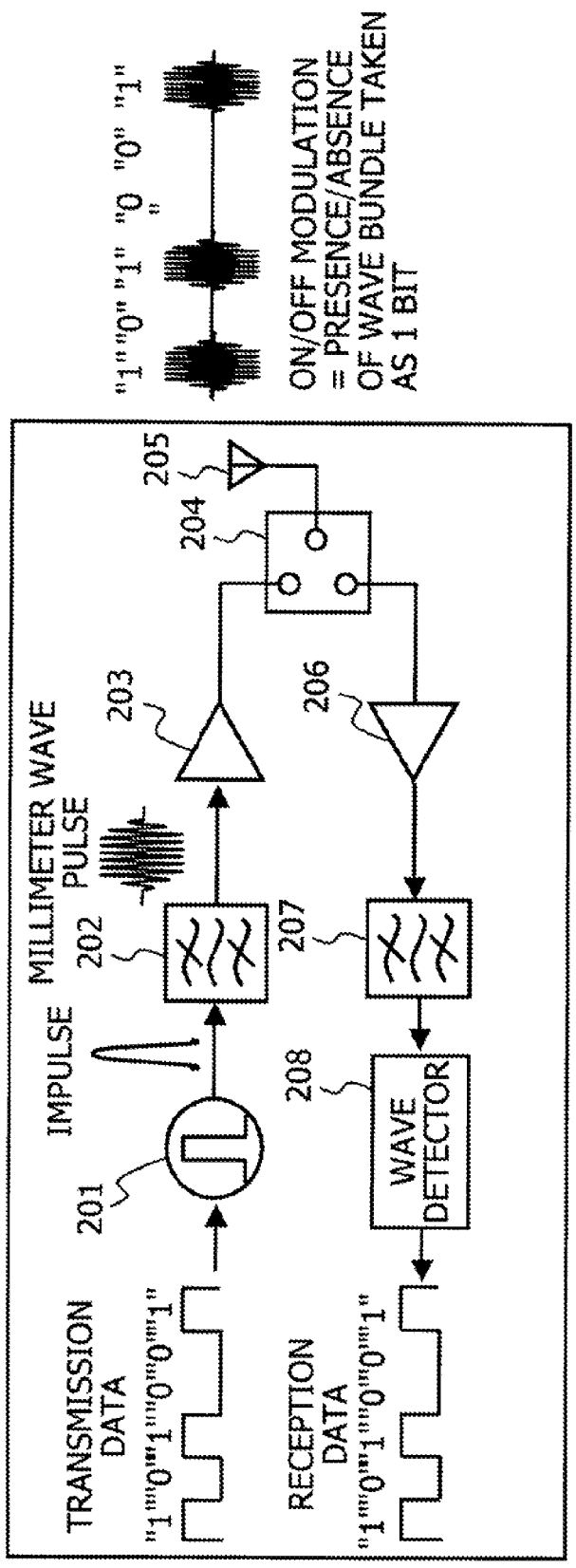
FIG. 13A is a configuration example of a radio communication apparatus.
Figure 13B:
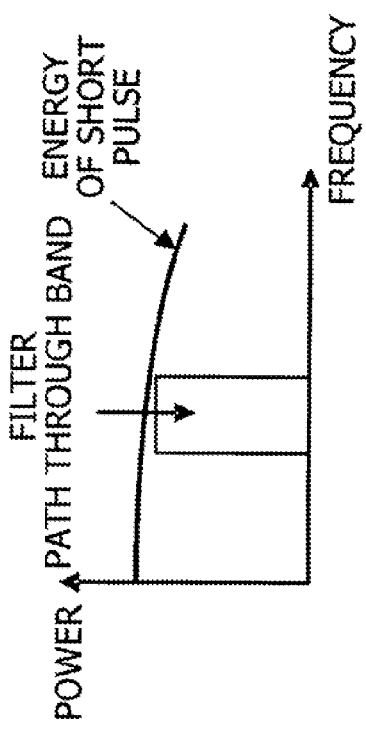
FIG. 13B is a diagram illustrating examples of a transmission band in the band pass filter.
Figure 15A:
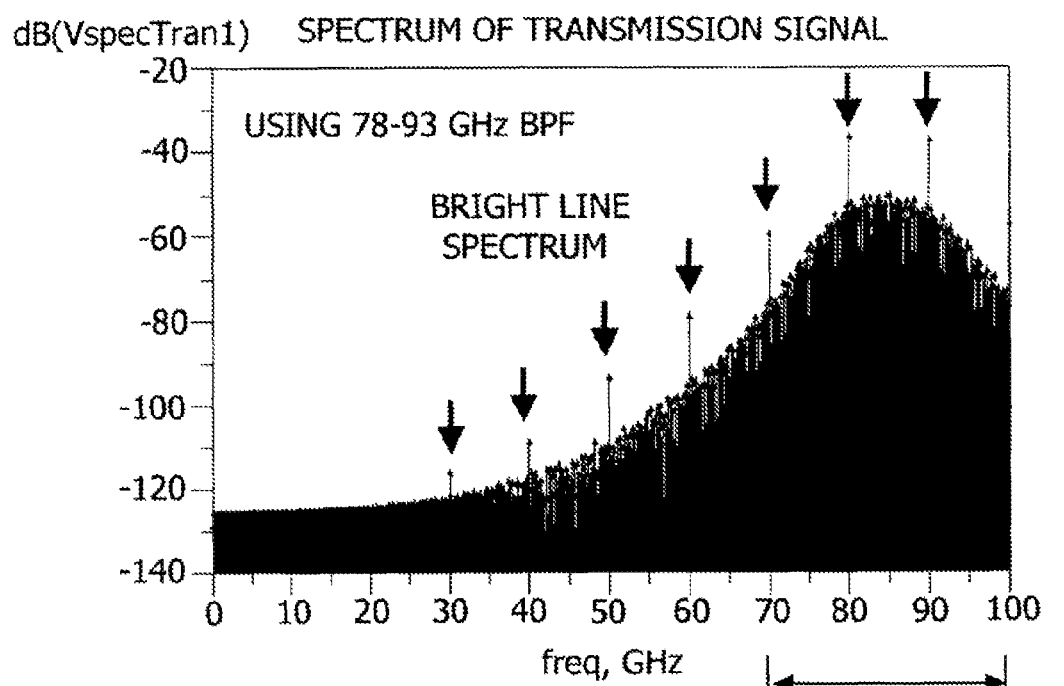
FIG. 15A and FIG. 15B are diagrams which respectively illustrate examples of the spectral distribution of a transmission signal.
Figure 15B:
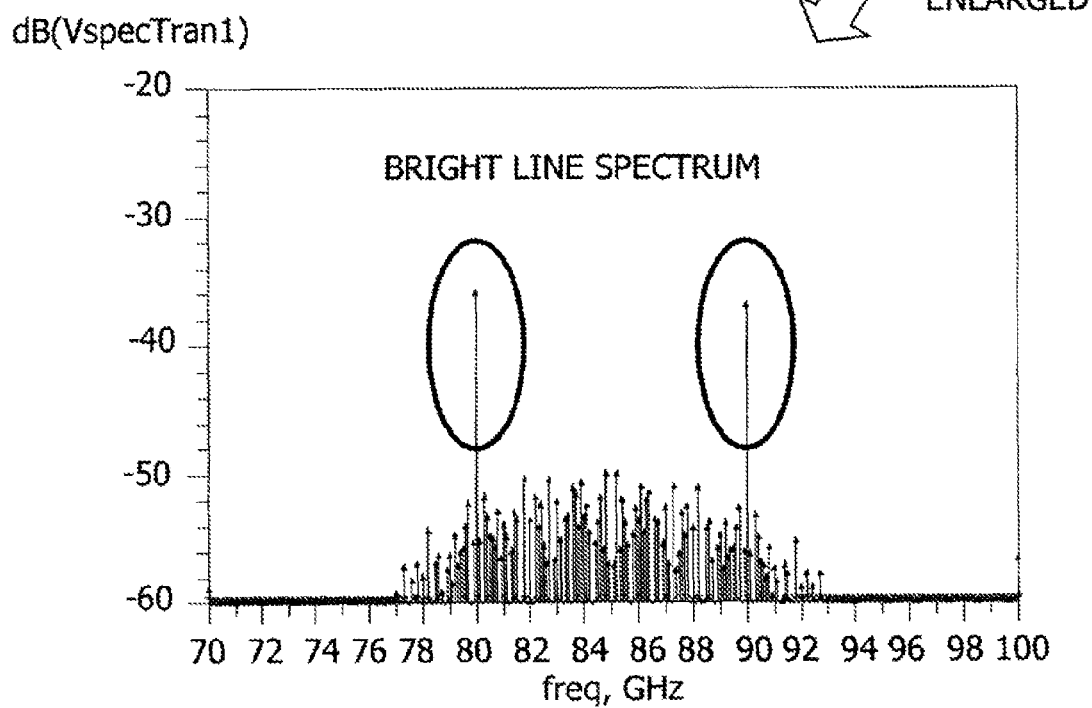

FIG. 12 is a diagram illustrating a configuration example of the radio communication apparatuses 100-1 and 100-2 according to the fifth embodiment. In this fifth embodiment, the radio communication apparatuses 100-1 and 100-2 both have the same configuration and are therefore described as the radio communication apparatus 100.

The radio communication apparatus 100 includes the random generator 102, RF transmission unit 103, and the antenna 101-1 which are included in the radio communication apparatus 100-1. The RF transmission unit 103 has the same configuration as the RF transmission unit 103 of the radio communication apparatus 100-1 illustrated in FIG. 3, for example.

Furthermore, the radio communication apparatus 100 includes the antenna 101-2 and the RF reception unit 150 included in the radio communication apparatus 100-2. The RF reception unit 150 has the same configuration as the RF reception unit 150 of the radio communication apparatus 100-2 illustrated in FIG. 4.

Since the radio communication apparatus 100 includes the RF transmission unit 103, then the reference pulse signal is generated by the reference pulse signal generator 106 and combined with the input data, thereby generating the radio signal which has no the bright line pulse, and the radio signal can be transmitted to the other radio communication apparatus.

Furthermore, since the RF reception unit 150 is included in the radio communication apparatus 100, the reference pulse signal is generated by the reference pulse signal generator 154 and combined with the reception data, whereby the reference pulse signal combined on the transmitting side can be removed.

Consequently, the radio communication apparatus 100 according to the fifth embodiment can transmit the radio signal over the distance equal to or greater than the threshold value, similarly to the second embodiment. Furthermore, the radio communication apparatus 100 according to the fifth embodiment can restore the data transmitted from the transmitting side, in a state of maintained quality, similarly to the second embodiment.

In the fifth embodiment, similarly to the third and fourth embodiments, it is also possible to prevent the occurrence of a bright line pulse by changing the intensity of the reference pulse signal from 50% of the intensity of the pulse signal corresponding to the input data, in the radio communication apparatus 100.

For example, the RF transmission unit 103 of the radio communication apparatus 100, similarly to the third embodiment, can be achieved by including the peak spectrum detection unit 116, data processing unit 120, digital to analog converter 121, operational amplifier 122, and control frame insertion unit 123.

In this case, similarly to the third embodiment, the RF reception unit 150 of the radio communication apparatus 100 can be achieved by including the control frame extraction unit 175.

Moreover, similarly to the fourth embodiment, the RF transmission unit 103 of the radio communication apparatus 100 can be achieved by including the data counter 130, data processing unit 131, digital to analog converter 132, and operational amplifier 133.

[Other Embodiments]

In the second to fifth embodiments, an all "1" signal is generated by the ALL "1" generator 107 in the reference pulse signal generator 106, and the reference pulse signal is generated based on the signal. It is also possible, for example, for the reference pulse signal generator 106 to generate the all "0" signal and generate the reference pulse signal based on the signal. In this case, the random generator 102 generates input data that is off when the digital value is "1" and is on when the digital value is "0".

It is possible to provide the radio communication apparatus and pulse signal transmission method in the radio communication apparatus whereby long-distance transmission of a radio signal can be achieved. Furthermore, it is possible to provide the radio communication apparatus and pulse signal transmission method for the radio communication apparatus whereby radio communication of maintained quality can be carried out.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A radio communication apparatus comprising:
    a first pulse signal generation unit which generates a first pulse signal corresponding to a data signal;
    a second pulse signal generation unit which generates a second pulse signal of opposite phase to the first pulse signal and amplifies the second pulse signal at a second amplification rate;
    an amplifier which amplifies the first pulse signal at a first amplification rate; and
    a combining unit which combines the amplified first pulse signal and the amplified second pulse signal, and transmits a combined pulse signal as a radio signal.

2. The radio communication apparatus according to claim 1, further comprising a band pass filter which filters the combined pulse signal and outputs the combined pulse signal of a prescribed frequency band,
    wherein the combined pulse signal of the prescribed frequency band output from the band pass filter is transmitted as the radio signal.

3. The radio communication apparatus according to claim 1, wherein the second pulse signal generation unit amplifies the second pulse signal at the second amplification rate which is an amplification rate that is half of the first amplification rate.

4. The radio communication apparatus according to claim 1, wherein the second pulse generation unit generates the second pulse signal based on a data all having code "1".

5. The radio communication apparatus according to claim 3, wherein further comprising a peak spectrum detection unit which causes the second amplification rate to change according to a changed occurrence probability, when the occurrence probability of a first or a second code included in the data signal changes from 50%.

6. The radio communication apparatus according to claim 3, further comprising a peak spectrum detection unit which causes the second amplification rate to change, when a peak signal in which a level of the combined pulse signal is equal to or greater than a threshold value is detected to the combined pulse signal output from the combining unit.

7. The radio communication apparatus according to claim 3, further comprising:
a data counter which counts a pulse included in the first pulse signal; and
a data processing unit which calculates an occurrence probability of a first or a second code included in the data signal based on a count value counted by the data counter, and causes the second amplification rate to change according to the calculated occurrence probability.

8. The radio communication apparatus according to claim 5, further comprising a control frame insertion unit which transmits the first pulse signal and a change value by which the second amplification rate is caused to change.

9. A radio communication apparatus comprising:
an amplifier which amplifies a combined pulse signal transmitted as a radio signal, which is a combination of a first pulse signal and a second pulse signal;
a third pulse signal generation unit which generates a third pulse signal of same phase as the first pulse signal and amplifies the third pulse signal at a second amplification rate;
a combining unit which combines the amplified third pulse signal and the amplified combined pulse signal, and outputs the amplified second pulse signal; and
a detection unit which detects the amplified second pulse signal and extracts a data signal from the amplified second pulse signal.

10. The radio communication apparatus according to claim 9, wherein the third pulse signal generation unit amplifies a first reference pulse signal being the generated third pulse signal at the second amplification rate amplified before combining of a second reference pulse signal combined with the received first pulse signal.

11. The radio communication apparatus according to claim 10, further comprising a control frame extraction unit which extracts a change value relating to the second amplification rate of the second reference pulse signal, from the received first pulse signal,
wherein the third pulse signal generation unit amplifies the first reference pulse signal at a changed amplification rate corresponding to the change value.

12. A radio communication apparatus comprising:
a radio transmission unit; and
a radio reception unit, wherein
the radio transmission unit includes:
a first pulse signal generation unit which generates a first pulse signal corresponding to a data signal;
a second pulse signal generation unit which generates a second pulse signal of opposite phase to the first pulse signal and amplifies the second pulse signal at a second amplification rate;
a first amplifier which amplifies the first pulse signal at a first amplification rate; and
a combining unit which combines the amplified first pulse signal and the amplified second pulse signal, and transmits a combined pulse signal as a radio signal, and
the radio reception unit includes:
a second amplifier which amplifies the combined pulse signal transmitted as the radio signal, which is a combination of the first pulse signal and the second pulse signal;
a third pulse signal generation unit which generates a third pulse signal of same phase as the first pulse signal and amplifies the third pulse signal at the second amplification rate;
a combining unit which combines the amplified third pulse signal and the amplified combined pulse signal, and outputs the amplified second pulse signal; and
the detection unit detects the amplified second pulse signal and extracts the data signal from the amplified second pulse signal.

13. A pulse signal transmission method including a first and second pulse signal generation units, an amplifier and a combination unit, the method comprising:
generating a first pulse signal corresponding to a data signal, by the first pulse signal generation unit;
generating a second pulse signal of opposite phase to the first pulse signal and amplifying the second pulse signal at a second amplification rate, by the second pulse signal generation unit;
amplifying the first pulse signal at a first amplification rate, by the amplifier; and
combining the amplified first pulse signal and the amplified second pulse signal and transmitting a combined pulse signal as a radio signal, by the combined unit.

14. A radio communication apparatus comprising:
a first pulse signal generation unit which generates a first pulse signal corresponding to a data signal;
a second pulse signal generation unit which generates a second pulse signal of opposite phase to the first pulse signal, and amplifies the second pulse signal at a second amplification rate corresponding to an occurrence probability of a first or a second code included in the data signal;
an amplifier which amplifies the first pulse signal at a first amplification rate; and
a combining unit which combines the amplified first pulse signal and the amplified second pulse signal, and transmits a combined pulse signal as a radio signal.

* * * * *